(12) United States Patent
Soga et al.

(10) Patent No.: US 7,075,183 B2
(45) Date of Patent: Jul. 11, 2006

(54) ELECTRONIC DEVICE

(75) Inventors: Tasao Soga, Tokyo (JP); Hanae Shimokawa, Tokyo (JP); Tetsuya Nakatsuka, Tokyo (JP); Kazuma Miura, Tokyo (JP); Mikio Negishi, Tokyo (JP); Hirokazu Nakajima, Tokyo (JP); Tsuneo Endoh, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/880,733

(22) Filed: Jun. 12, 2001

(65) Prior Publication Data

US 2002/0171157 A1 Nov. 21, 2002

(30) Foreign Application Priority Data

Jun. 12, 2000 (JP) .............................. 2000-180719
Dec. 25, 2000 (JP) .............................. 2000-396905

(51) Int. Cl.
*H01L 29/40* (2006.01)

(52) U.S. Cl. ....................................... 257/772; 257/779

(58) Field of Classification Search ................ 257/783, 257/779, 738, 772, 780
See application file for complete search history.

(56) References Cited

U.S. PATENT DOCUMENTS

| | | | |
|---|---|---|---|
| 4,749,594 A | 6/1988 | Malikowski | |
| 5,178,685 A * | 1/1993 | Borenstein et al. | ......... 136/244 |
| 5,355,016 A | 10/1994 | Swirbel et al. | |
| 5,427,865 A | 6/1995 | Mullen et al. | |
| 5,520,752 A | 5/1996 | Lucey et al. | |
| 5,679,055 A | 10/1997 | Greene et al. | |
| 5,795,799 A | 8/1998 | Hosoya | |
| 5,818,699 A | 10/1998 | Fukuoka | |
| 5,834,848 A * | 11/1998 | Iwasaki | ...................... 257/778 |
| 5,928,404 A | 7/1999 | Paruchuri et al. | |
| 5,941,759 A | 8/1999 | Kitajima et al. | |
| 5,964,646 A | 10/1999 | Kassir et al. | |
| 5,980,366 A | 11/1999 | Waddle et al. | |
| 6,042,459 A | 3/2000 | Honda | |
| 6,132,289 A | 10/2000 | Labunsky et al. | |
| 6,207,259 B1 * | 3/2001 | Iino et al. | ................... 428/209 |
| 6,217,433 B1 | 4/2001 | Herman et al. | |
| 6,227,950 B1 | 5/2001 | Hempel et al. | |
| 6,235,996 B1 | 5/2001 | Farooq et al. | |
| 6,239,013 B1 | 5/2001 | Hotchkiss | |
| 6,365,973 B1 | 4/2002 | Koning | |
| 6,569,262 B1 | 5/2003 | Shohji | |

FOREIGN PATENT DOCUMENTS

| | | |
|---|---|---|
| JP | 03-281093 A | 12/1991 |
| JP | 04-48770 A | 2/1992 |
| JP | 04-371394 A | 12/1992 |
| JP | 7-235565 A | 9/1995 |

(Continued)

OTHER PUBLICATIONS

So, William et al., High Temperature Joints Manufactured at Low Temperature, IEEE, Jun. 1998, pp. 284-291, 1998 Electronic Components and Technology Conference.

*Primary Examiner*—Leonardo Andújar
(74) *Attorney, Agent, or Firm*—Townsend and Townsend and Crew LLP

(57) ABSTRACT

Each of junctions formed between a semiconductor device and a substrate comprises metal balls of Cu etc. and compounds of Sn and the metal balls, and the metal balls are bonded together by the compounds.

9 Claims, 19 Drawing Sheets

FOREIGN PATENT DOCUMENTS

| | | |
|---|---|---|
| JP | 10-163270 A | 6/1997 |
| JP | 11-186712 A | 7/1999 |
| JP | 2000-49460 A | 2/2000 |
| JP | 2000-52027 A | 2/2000 |
| JP | 2000-116571 A | 4/2000 |
| JP | 3074649 B | 6/2000 |
| JP | 2000-223831 A | 8/2000 |
| JP | 2000-246483 | 9/2000 |
| JP | 2001-9587 A | 1/2001 |
| JP | 2001-205476 A | 7/2001 |
| WO | WO 97/12718 | 4/1997 |
| WO | WO98/08362 | 2/1998 |

\* cited by examiner (a)

(b)

(a)

(b)

(c)

(a)

(b)

(c)

(a) STEPS OF ASSEMBLING MODULE (b) STEPS OF SECONDARY MOUNTING AND ASSEMBLING OF MODULE (a)

| Sn / Cu | EVALUATION AND JUDGING | REASONS FOR JUDGING |
|---|---|---|
| 10 / 4 | ✕ | ↑ |
| 10 / 5 | ✕ | EXCESS OF Sn |
| 10 / 7 ( 1.43 ) | △ | PROPER RANGE |
| 10 / 8 ( 1.25 ) | △~○ | PROPER RANGE |
| 10 / 10 | ○ | PROPER RANGE / PREFERRED RANGE |
| 10 / 12.5 ( 0.8 ) | ○ | PROPER RANGE / PREFERRED RANGE |
| 10 / 15 | △~○ | PROPER RANGE |
| 10 / 16.7 ( 0.6 ) | △ | PROPER RANGE |
| 10 / 25 | ✕ | SHORT OF Sn |
| 10 / 50 | ✕ | ↓ |
| 10 / 100 | ✕ | ↓ |

CRITERION FOR JUDGING : ○ : PROPER    △ : ALMOST PROPER    ✕ : SHORT (ON EXCESS) OF Sn

ELECTRONIC DEVICE

CROSS REFERENCE TO RELATED APPLICATION

This application claims priority from Japanese Application No. 2000-180719, filed Jun. 12, 2000 and from Japanese Application No. 2000-396905, filed Dec. 25, 2000.

BACKGROUND OF THE INVENTION

The present invention relates to a technique for performing solder bonding through the use of a temperature hierarchy effective in the module mounting of electronic devices, etc.

In Sn—Pb-base solders, soldering has so far been performed by temperature-hierarchical bonding in which parts are soldered first at temperatures between 330° C. and 350° C. by use of high-temperature solders, such as Pb-rich Pb-5 mass % Sn (hereinafter the indication of "masss %" is omitted and only a numeral is recited) solders (melting point: 314–310° C.) and Pb-10Sn solders (melting point: 302–275° C.), and bonding is then performed with the aid of Sn-37Pb eutectics (183° C.) of a low-temperature solder without melting soldered portions. This temperature-hierarchical bonding is adopted in semiconductor devices in which chips are die bonded, and in semiconductor devices of flip chip bonding, etc. In other words, in semiconductor fabrication processes, it has become important to provide temperature-hierarchical bonding between a solder used within a semiconductor device and another solder for bonding the semiconductor device itself to a substrate.

On the other hand, in some products there have been cases in which bonding at a temperature of not more than 290° C. is requited in consideration of the heat resistance limit of parts. As solders in a composition range for high-temperature soldering suited to this requirement in conventional Sn—Pb-base solders, a Pb-15Sn solder (liquidus temperature: 285° C.) and solders with similar compositions can be conceived. However, when the Sn content becomes higher than this level, low-temperature eutectics (183° C.) precipitate. Furthermore, when the Sn content becomes lower than this level, the liquidus temperature rises, with the result that bonding at a temperature of not more than 290° C. becomes difficult. For this reason, even in a case where a secondary reflow solder for bonding to a printed circuit board is a eutectic Sn—Pb-base solder, it has become impossible to avoid the problem of remelting of bonds of high-temperature solder. When Pb-free solders are used for secondary reflow, bonding is performed at temperatures of 240–250° C., which are about 20–30° C. higher than with eutectic Sn—Pb-base solders, and therefore the bonding at a temperature of not more than 290° C. becomes more difficult.

More specifically, at present there is no high-temperature Pb-free soldering materials that permit temperature-hierarchical bonding at a soldering temperature ranging from 330 to 350° C. or at a temperature level of 290° C.

This situation is described in detail below. At present, Pb-free solders are being used in increasingly many applications in terms of environmental issues. In Pb-free solders for soldering to printed circuit boards, eutectic Sn—Ag-base solders, eutectic Sn—Ag—Cu-base solders and eutectic Sn—Cu-base solders are going mainstream. As a result, the soldering temperature in surface mounting is usually in the range of 240 to 250° C. There is no Pb-free solder for a temperature hierarchy on the higher-temperature side that can be used in combination with these eutectic Pb-free solders. As solders that provide the most suitable combinations, there are available Sn-5Sb solders (240–232° C.). However, when temperature variations on a substrate in a reflow furnace, etc., are considered, there is no highly reliable solder on the lower-temperature side that can perform bonding without melting the Sn-5Sb solders. On the other hand, although an Au-20Sn solder (melting point: 280° C.) is known as a high-temperature solder, its use is limited because it is a hard material and its cost is high. Especially, in bonding an Si chip to a material having a substantially different coefficient of expansion or in bonding a large-size Si chip, this solder is not used because it is hard and might break Si chips.

SUMMARY OF THE INVENTION

Against the above background, it is required that the necessity of use of Pb-free solders be met and that in mounting a module, after bonding by use of a higher-temperature side solder at a temperature of not more than 290° C., which does not exceed the heat resistance of parts (primary reflow), the terminal of the module be surface mounted (secondary reflow) to the external connection terminal of a printed circuit board, etc. by use of Sn-3Ag-0.5Cu solders (melting point: 217–221° C.). For example, a module for a portable product in which chip parts and semiconductor chips are mounted (example: a high-frequency module) has been developed. In this module, the chip parts and semiconductor chips are bonded to the module substrate by use of high-temperature solders and cap encapsulation or resin encapsulation is required. These chip parts require bonding at a temperature of not more than 290° C. maximum in terms of heat resistance. When the secondary reflow of this module is performed by use of an Sn-3Ag-0.5Cu solder, the soldering temperature reaches about 240° C. Therefore, because even an Sn-5Sb solder, which has the highest melting point of all Sn-base solders, has a melting point of 232° C. and because the melting point decreases further when the plating of a chip electrode contains Pb, etc., it is impossible to avoid the remelting of the soldered portions of the chip parts in the module. Accordingly, a system or process that does not pose a problem even when a solder remelts is required.

It has been conventional practice to perform die bonding of chips to the module substrate at 290° C. maximum by use of Pb-base solders and to perform the reflow of the chip parts. A soft silicon gel has been applied to wire-bonded chips, the top surface of the module substrate has been protected with a cap made of Al, etc., and secondary reflow has been performed by use of eutectic Sn—Pb solders. For this reason, in secondary reflow, stresses are not applied even when part of the solder of module junctions melts and, therefore, the chips do not move and there is no problem in high-frequency characteristics. However, it becomes necessary to perform secondary reflow by use of Pb-base solders and, at the same time, it has become necessary to develop a resin encapsulation type module in order to reduce cost. In order to break through this, it is necessary to solve the following problems.

1) Reflow soldering in the air at a temperature of not more than 290° C. must be possible (guaranteed heat resisting temperature of chip parts: 290° C.).
2) Melting must not occur in secondary reflow (260° C. maximum) or even if melting occurs, chips must not move (because high-frequency characteristics are affected if chips move).

3) Even when the solder within the module remelts during secondary reflow, a short circuit due to the volume expansion of the solder of the chip parts must not occur.

Specifically, problems in the results of an evaluation of an RF (radio frequency) module are stated below.

In an RF module, chip parts and a module substrate were bonded together by use of a conventional Pb-base solder (although this solder has a solidus line of 245° C., an Sn—Pb-base solder plating is applied to the connection terminals of the chip parts; for this reason, low-temperature Sn—Pb-base eutectics are formed and, therefore, remelting occurs) and the occurrence rate of short circuits due to the outflow of the solder after secondary mounting reflow was investigated in the module which was encapusulated so that it was covered by one operation with various types of insulating resins having varied moduli of elasticity.

FIG. 12(a) is an explanatory drawing of outflow, which show the principle of solder flow during the secondary mounting reflow of chip parts in a module. FIG. 12(b) is a perspective view of an example of solder flow of chip parts.

The mechanism of a short circuit due to a solder outflow is such that the melting and expanding pressure of a solder within a module causes the interfaces between chip parts and a resin or the interface between the resin and a module substrate to be exfoliated and the solder flows into the exfoliated interface(s), with the result that the terminals at both ends of a surface mounted part are connected to each other, causing a short circuit.

As a result of the above investigation, it became apparent that the incidence of short circuits due to a solder outflow is in proportion to the modulus of elasticity of resins. It became also apparent that conventional high-elasticity epoxy resins are inappropriate and that in the case of soft silicone resins, short circuits do not occur when the modulus of elasticity at 180° C. (melting point of Sn—Pb eutectics) is low.

However, because low-elasticity resins in practical use are silicone resins, during the process of substrate dividing, part of the resins cannot be completely divided and, in some cases, remain for reasons of resin properties. Therefore, a process of making cuts by a laser, etc. becomes necessary. On the other hand, in the case of general epoxy resins, mechanical dividing is possible although short circuits occur because of hardness and these resins are inappropriate. However, in terms of resin properties, it is at present difficult to make the resins soft to such an extent that short circuits doe not occur at 180° C. If it is possible to perform resin encapsulation that serves as mechanical protection and can, at the same time, prevent a solder outflow, covering with a case or cap is unnecessary and, therefore, cost can be reduced.

An object of the present invention is to provide a completely new solder paste, a method of solder bonding, and a soldered joint structure.

Another object of the invention is to provide temperature-hierarchical bonding by use of a solder capable of maintaining bonding strength at high temperatures.

A still another object of the invention is to provide an electronic device in which temperature-hierarchical bonding is performed by use of a solder capable of maintaining bonding strength at high temperatures.

Representative essential features of the invention disclosed in this application to achieve the above objects are summarized below.

In the invention, as a solder for bonding electronic parts and a substrate together, a solder paste containing Cu balls and Sn solder balls is used.

According to the invention, there is provided an electronic device provided with electronic parts and a substrate, in which the pads of the electronic parts and the pads of the substrate are bonded by junctions each containing Cu balls and a compound of Cu and Sn, and the Cu balls are bonded together by the compound of Cu and Sn.

Further, according to the invention, in an electronic device in which a primary substrate having electronic parts mounted thereon is mounted on a secondary substrate such as a printed circuit board and mother board, the bonding of the electronic parts to the primary substrate is performed by the reflow of the solder paste containing the Cu balls and Sn solder balls and the bonding of the primary substrate to the secondary substrate is performed by the reflow of an Sn-(2.0–3.5)Ag-(0.5–1.0)Cu solder.

For example, regarding temperature-hierarchical bonding, even when a part of solder on the higher-temperature side that has already been bonded melts, the solder can provide strength high enough to withstand a process during later solder bonding if other portion does not melt.

The melting points of intermetallic compounds are high. Because portions bonded with intermetallic compounds can provide sufficient bonding strength even at 300° C., intermetallic compounds can be used for temperature-hierarchical bonding on the higher-temperature side. Therefore, the present inventors performed bonding by use of a paste which is a mixture of Cu (or Ag, Au, Al or plastic) balls or these balls whose surfaces are plated with Sn, etc. and Sn-base solder balls, both of them being mixed at a volume ratio of about 50% to about 50%. As the result, in portions where the Cu balls are in contact with each other or in close vicinity to each other, a reaction with surrounding molten Sn occurs and a $Cu_6Sn_5$ intermetallic compound is formed because of diffusion between Cu and Sn, making it possible to ensure sufficient bonding strength between the Cu balls at high temperatures. Because the melting point of this compound is high and sufficient strength is ensured at a soldering temperature of 250° C. (only the Sn portion melts), no exfoliation of bonded portions occurs during secondary reflow performed for mounting onto a printed circuit board. Therefore, the soldered portions of a module are made of a composite material having two functions, that is, the first function of ensuring high-temperature strength during the secondary reflow by elastic bonding force brought about from the bonding of the high-melting point compound and the second function of ensuring service life by the flexibility of soft Sn during temperature cycles. Therefore, the soldered portions can be adequately used in the temperature-hierarchical bonding at the high temperatures.

Furthermore, also in the case of hard and high-rigidity solders having desirable melting points, such as an Au-20Sn solder, Au-(50–55)Sn solders (melting point: 309–370° C.) and an Au-12Ge (melting point: 356° C.), by using granular particles and dispersing and mixing soft and elastic rubber particles or by dispersing and mixing soft low-melting point solders of Sn, In, etc. among the above hard and high-rigidity solders, it is possible to ensure bonding strength even at temperatures of not less than the solidus temperatures of the above hard and high-rigidity solders and to relieve phenomena caused due to deformation, by the soft Sn, In or rubber among metal particles, whereby such a new effect as to compensate for the drawbacks of solders can be expected.

Next, means for solution regarding a resin-encapsulated RF module structure are stated.

Conceivable measures to prevent shorts from being caused by a solder include (1) adopting a structure in which the solder within the module does not melt in secondary mounting reflow and (2) adopting another structure in which even when the solder within the module melts, the exfoliation at the interfaces between parts and the resin and at the interface between the resin and the module substrate is prevented by reducing the melting-and-expanding pressure of the solder. However, resin design is difficult in these measures.

On the other hand, (3) relieving the melting-and-expanding pressure of a molten internal solder by use of a low-hardness resin in a gel state, etc. is conceivable. However, because of a small protective force (mechanical strength), covering with a case or cap is required. This measure cannot be adopted because of a cost increase.

FIG. 13 (which will be described later) shows a comparison of phenomena of molten solder flow between a case where a conventional solder is used in a resin encapsulation structure and another case where the solder of the invention is used. The volume expansion of Pb-base solders is 3.6% [Science and Engineering of Metallic Materials; Masuo Kawamori, p. 14442]. In a bonding structure of the invention, only Sn melts at temperatures of about 240° C. during secondary reflow mounting. Therefore, in view of the fact that the volume ratio of Cu balls to Sn balls is about 50%, the volume expansion immediately after melting is 1.4%, which is about 1/2.5 of that of Pb-base solders. On the other hand, regarding the state of remelting, the conventional solder instantaneously expands 3.6% when it remelts. Therefore, in the case of a hard resin, since the resin cannot be deformed, the pressure increases, with the result that the molten solder flows into the interfaces between the chip parts and the resin. For this reason, it is necessary that the resin be soft. On the other hand, with the solder of the invention, as is apparent from a model of the section of a chip shown in FIG. 1, Cu particles are bonded together mainly via $Cu_6Sn_5$ compounds. Even when the Sn in the gap among Cu particles melts, the Cu particles do not move because they are bonded together. Therefore, the pressure by the resin can be coped with by the reaction force of the bonded Cu particles, with the result that a pressure is not easily applied to the molten Sn. Further, since the volume expansion of the bonded portion is as low as 1/2.5 of that of the conventional solder, it is expected that, because of the synergistic effect of both of them, the possibility that Sn flows over the interfaces of chip parts is low. Thus, by adopting the bonding structure of the invention in this module, it is possible to provide a low-cost RF module which can be encapsulated with a somewhat softened epoxy resin and which, at the same time, can be easily cut.

BRIEF DESCRIPTION OF THE DRAWINGS

FIG. 19 shows the relationship between the Sn/Cu ratio and an appropriate range of bonding.

DESCRIPTION OF THE PREFERRED EMBODIMENTS

Embodiments of the invention are described below.

Embodiment 1

Figure 1:
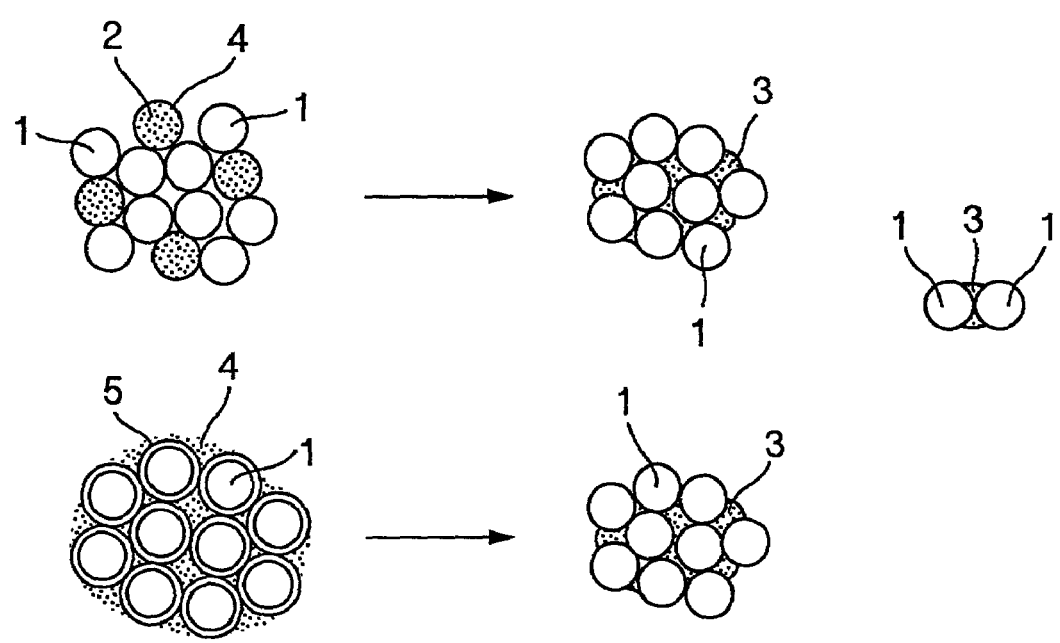
FIG. 1 is a sectional view of a model showing the material and constitution of a paste for bonding.

FIG. 1 shows the concept of a bonding structure relating to the invention. This figure also shows a condition before soldering and another condition after soldering. The upper portions of FIG. 1 shows an example of use of a paste in which Cu balls 1 with a particle size of about 30 μm (or balls of Ag, Au, Cu—Sn alloys, etc., or those to which an Au plating, and Ni/Au plating, etc., are applied, or those to which an Sn plating, etc., are applied) and Sn solder balls 2 (melting point: 232° C.) with a particle size of about 30 μm are appropriately dispersed in small quantities via a flux 4. When this paste is subjected to reflow at a temperature of not less than 250° C., the Sn solder balls 2 melt, molten Sn 3 spreads so that it wets the Cu balls 1 and becomes present between the Cu balls 1 relatively uniformly. The Cu balls need not be spherical; that is, Cu balls having great surface irregularities, bar-like ones, and those containing dendrite crystals may be used. In this case, the cubic ratio of Cu to Sn is different and it is only necessary that a Cu ball be in contact with an adjoining Cu ball. The superiority of the spherical shape lies in printability. After bonding, to ensure strength at high temperatures, it is necessary that the Cu balls be entangled with each other. On the other hand, if the Cu balls are too much constrained by each other to move, there is no degree of freedom in soldering and deformability is insufficient, posing a problem. Regarding this respect, it seems ideal that the Cu balls in which dendritic crystals are linked by contact with the result that elastic motion occurs. Thus, there is a method in which dendritic crystals of Cu are wrapped with Sn, etc. and are then sphered and the spheres are mixed. Incidentally, the particle size of the Cu and Sn balls is not limited to about 30 μm.

Because $Cu_6Sn_5$ compounds are formed in a short time by using a reflow temperature as high as possible, the aging process for the forming of the compound becomes unnecessary. When the forming of the $Cu_6Sn_5$ compound is insufficient, it is necessary to ensure the strength of bonding between the Cu balls 1 by performing short aging in a temperature range of the heat resistance of the parts. Because the melting point of the $Cu_6Sn_5$ compound is as high as about 630° C. and the mechanical properties of the $Cu_6Sn_5$ compound are not poor, there is no problem in strength. If the aging is performed for a long time at a high temperature, $Cu_3Sn$ compound comes to grow to the Cu side. It is thought that, regarding mechanical properties, $Cu_3Sn$ is generally deemed to be hard and brittle. However, even when $Cu_3Sn$ is formed within the solder around each of the Cu particles, there is no problem insofar as it has no effect on service life measured in a temperature cycle test, etc. In an experiment in which $Cu_3Sn$ was sufficiently formed at a high temperature in a short time, there was no problem in strength. It is thought that this is because there is a difference in the effect of $Cu_3Sn$ on fracture between such a case where $Cu_3Sn$ is formed long along the bonding interface as to have so far been experienced and such another case where $Cu_3Sn$ is formed around each of the particles as in this example. It is also thought that in the present case, a supplementary effect of soft Sn present around the compound is also great.

Since, as disclosed above, the Cu balls 1 are bonded to each other via the compounds ($Cu_6Sn_5$), neither junctions ($Cu_6Sn_5$) nor Cu balls 1 melt, it becomes possible to provide the bonding strength even when the module passes through a reflow furnace at about 240° C. after bonding. In taking the reliability of bonding among the Cu balls 1 into account, it is preferred that the compounds ($Cu_6Sn_5$) be formed with a thickness of about a few micrometers. Further, to ensure that the compounds are formed among the Cu balls 1, it is preferred the gap between the Cu balls be short so that they almost come into contact with each other. This is made possible by adjusting the amount of Sn. However, it is not necessary that all adjoining Cu particles be bonded together by the compound. Instead, in terms of probability, it is preferred that portions where linkage occurring by the compound does not occur are present, because this provides a degree of freedom in deformation. When the Cu balls are constrained within a region, there is no problem in strength. Incidentally, the flux 4 may be any one of a cleaning type and a non-cleaning type.

The upper portions of FIG. 1 shows another example in which the above Cu balls 1 are plated with Sn, etc. of a few micrometers in thickness. When the amount of Sn is insufficient due to thin Sn plating, the insufficient amount of Sn is compensated for by the Sn balls of the same ball diameter. The Sn plating of Cu enables the molten Sn 3 to readily spread along the balls and wet them, making the gaps among the Cu balls 1 more even. Further, this has also a great effect on the elimination of voids. The oxide film of the solder plating is broken during reflow and the Cu balls are sucked by each other under the action of surface tension and approach each other. Further, the fluidity of the solder is improved by adding a trace amount (1–2%) of Bi, etc. to Sn to thereby improve the wettability of the solder onto terminals. However, addition of a large amount of Bi is undesirable because the solder becomes brittle.

Next, electronic parts such as LSI packages and parts having this bonding structure are mounted on a printed circuit board. In this mounting, temperature-hierarchical bonding becomes necessary. For example, after printing of an Sn-3Ag-0.5Cu solder paste (melting point: 221–217° C.) on connection terminals of a printed circuit board and mounting of electronic parts such as LSI packages and parts, reflow can be performed at 240° C. in the air (this is possible also in a nitrogen atmosphere). This Sn-(2.0–3.5)Ag-(0.5–1.0)Cu solder is treated as a standard solder that replaces conventional eutectic Sn—Pb solders. However, because this solder has a higher melting point than the eutectic Sn—Pb solders, it is required that a high-temperature Pb-free solder suitable for this purpose be developed. As mentioned above, the strength at the high temperatures is ensured between Cu and $Cu_6Sn_5$ in already formed junctions and the strength of the junctions is high enough to withstand stresses caused by the deformation of a printed circuit board during reflow, etc. Therefore, even when an Sn-(2.0–3.5)Ag-(0.5–1.0)Cu solder is used for the secondary reflow for soldering to a printed circuit board, this solder can realize temperature-hierarchical bonding because it has such a function as to be a high-temperature solder. In this case, the flux to be used may be an RMA (rosin mild activated) type for non-cleaning application or an RA (rosin activated) type for cleaning application, and any one of both of the cleaning type and the non-cleaning type can be used.

Embodiment 2

Figure 2:
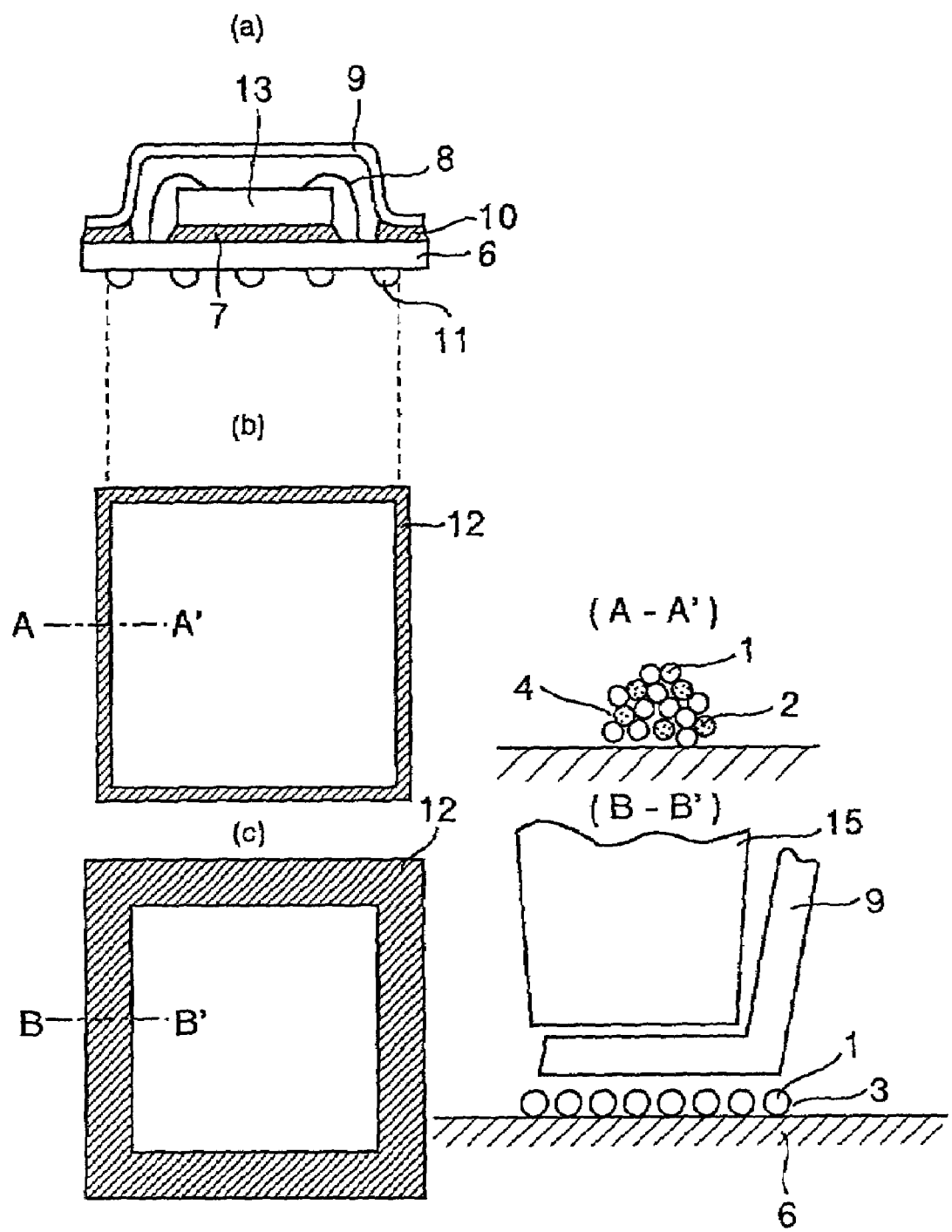
FIG. 2(a) shows a model of a section regarding an example to which the invention is applied and FIG. 2(b) and FIG. 2(c) are model views of a method of paste supply and a bonded condition, respectively.

In FIG. 2(a), a semiconductor device 13 is bonded to a junction substrate 6 by use of an Au-20Sn solder, etc. and after wire bonding 8, the peripheral portion of a cap 9, which is fabricated by plating Al, Fe—Ni, etc. with Ni—Au, is bonded 10 to the junction substrate by reflow through the above solder paste of non-cleaning type. On this occasion, when the insulating characteristic is regarded as important, it is desirable to perform bonding in a nitrogen atmosphere by use of a solder with a flux not containing chlorine. However, when the wettability cannot be ensured, the encapsulation with a weak-activity rosin of RMA type may be performed. This semiconductor device is not required to have a perfect encapsulatability and, therefore, if the flux has adequate insulating characteristics, there occurs no influence of holding for a long time on the semiconductor device even in the presence of the flux. The purpose of the cap encapsulation is mainly mechanical protection. As a method of the encapsulation, it is possible to perform the pressure bonding of a sealing portion by means of a pulse-current resistance heating body 15, etc. In this case, the application of the paste is performed along the sealing portion by means of a dispenser and a fine continuous pattern 12 are formed (FIG. 2(b)).

A model in which the section A–A' of the pattern is enlarged is shown on the right side. Cu balls 1 and Sn balls 2 are held by a flux 4. When bonding is performed by means of the pulse-current resistance heating body 15 while applying a pressure from above, the paste is made flat as shown in FIG. 2(c). Section B–B' which is made flat is enlarged on the right side. In this case, when Cu balls of 30 μm are used, the solder bonding portion between a junction substrate 6 and a cap 9 provides a gap corresponding to 1 to 1.5 Cu ball (about 50 μm). Because bonding under pressure by means of the pulse heater was performed at 350° C. for 5 seconds, the contact portion between the Cu ball 1 and the terminal of the junction substrate 6 and the contact portion between the Cu ball and the cap 9 readily form $Cu_6Sn_5$ or $Ni_3Sn_4$ compounds in a short time insofar as a thick Cu-base or Ni-base plating layer is formed on the cap surface. In this case, therefore, the aging process is generally unnecessary. When a narrow paste application width is intentionally adopted, for example, when the paste is applied under pressure to a section of 250

μm in width×120 μm in height, the thickness of the section becomes equivalent to the thickness of 1 to 1.5 particle after pressure application and hence it comes to spread to a width of about 750 μm.

Eutectic Sn-0.75Cu solder balls are supplied beforehand to this encapsulated package as external junction terminals 11, and on the printed circuit board, the solder paste is positioned and provided, as with other parts, by printing, and the surface mounting is performed by reflow. As a reflow solder, any one of an Sn-3Ag solder (melting point: 221° C., reflow temperature: 250° C.), an Sn-0.75Cu solder (melting point: 228° C., reflow temperature: 250° C.), Sn-3Ag-0.5Cu solders (melting point: 221–217° C., reflow temperature: 240° C.), and etc. may be used. Because as is apparent from the results so far obtained, sufficient strength is ensured between Cu and $Cu_6Sn_5$ by the eutectic Sn—Pb solder, encapsulated portions, etc., are not exfoliated during reflow. Incidentally, when a lap-type joint portion obtained by bonding pieces of Cu foil together by use of this solder paste was subjected to a shearing tensile test (tensile rate: 50 mm/min) at 270° C., the value of about 0.3 kgf/mm$^2$ were obtained. This reveals that a sufficient strength at high temperatures is ensured in the junction.

In the case of a module whose cap portion is made of Al plated with Ni—Au or made of Fe—Ni plated therewith, the growth rate of an Ni—Sn alloy layer at a temperature of not less than 175° C. is higher than that of a Cu—Sn alloy layer insofar as the Ni-containing layer is formed with a film thickness of about 3 μm (for example, D. Olsen et al.; Reliability Physics, 13th Annual Proc., pp 80–86, 1975) and, therefore, an $Ni_3Sn_4$ alloy layer is also sufficiently formed by high-temperature aging. However, as regards the properties of the alloy layer, $Cu_6Sn_5$ is superior. Thus, it is not preferred to make the $Ni_3Sn_4$ alloy layer grow to have a thicker thickness. In this case, because the high-temperature aging cannot be made to be a long period of time, there occurs no problem of embrittlement caused due to excessive growth. From data on an Sn-40Pb solder which has a lower growth rate of an alloy layer than Sn and which has been used in actual operations, it is possible to predict an outline of the growth rate of Sn. The growth rate of occurring by Ni and Sn-40Pb is not more than 1 μm even at 280° C. in 10 hours (according to some data, the growth rate is 1 μm at 170° C. in 8 hours). Thus, no problem of the embrittlement occurs insofar as the high temperature aging is short in the period of time. As regards the growth rate of the alloy layer ($Ni_3Sn_4$) occurring by Sn and the Ni plating, it is known that the growth rate thereof differs greatly in dependence on the types of plating such as electroplating and chemical plating etc. Because it is necessary to keep the high bonding strength, a high growth rate of the alloy layer is desired in the embodiment. On the other hand, there is such a data as the growth rate of $Cu_6Sn_5$ occurring by Cu and the Sn-40Pb solder is 1 μm at 170° C. in 6 hours (which corresponds to a growth rate of 1 μm per one hour at 230° C. in the case of the Sn-0.75Cu eutectic solder balls used in the embodiment on the assumption that the solder balls are simply in a solid state). In a bonding experiment at 350° C. for 5 seconds, the inventors were able to observe portions where $Cu_6Sn_5$ of 5 μm maximum in thickness were formed between Cu particles. From this fact, it is deemed that no aging process is generally necessary when the soldering is performed at the high temperature.

In this paste method, it is also one of the most important problems to reduce the occurrence of voids as little as possbile. For this reducing, it is important to improve the wettability of the solder for the Cu particles and to improve the fluidity of the solder. For achieving this, the Sn plating on the Cu balls, Sn—Cu solder plating thereon, Sn—Bi solder plating thereon and Sn—Ag solder plating thereon, the adoption of eutectic Sn-0.7Cu solder balls, Bi addition to solder balls, and etc., are effective means.

Further, the solder balls are not limited to Sn solder balls, and solder balls may be used in which any one or more of eutectic Sn—Cu-base solder balls, eutectic Sn—Ag-base solder balls, eutectic Sn—Ag—Cu-base solder balls, and solder balls obtained by adding at least one element selected from In, Zn, Bi, etc. to any one of these solder balls may be used. Also, in these cases, because Sn is the main element of the composition, the desired compound can be formed. Also, two or more kinds of balls may be mixed. Because in these balls the melting point of these balls is lower than Sn, the growth rate of the alloy layer at high temperatures generally tends to become high.

Embodiment 3

The paste relating to the invention can also be used in the die bonding 7 shown in FIG. 2(a). After bonding by use of the paste relating to the invention, cleaning and wire bonding are performed. In prior arts, the die bonding is performed by use of an Au-20Sn solder, however, it has been limited to small chips in view of reliability. Also, in the case of Pb-base solders, a Pb-10Sn solder, etc., have been used. The bonding relating to the invention can be used even in chips having a somewhat larger area. The larger the thickness of a bonding portion, the longer the service life and the higher the reliability become. In the invention, it is possible to make this thickness larger by using high melting point balls each having a larger size. In a case of making this thickness small, this is performed by making the size of particles (, that is, balls) small. In some bonding methods, it is also possible to use a thin bonding portion by reducing the particle size. Even Cu particle sizes of 5–10 μm may be also used, and particles of further smaller size may be mixed therewith. The compounds occurring between an Si chip (Cr—Cu—Au, Ni plating, etc., is provided as the metallized layer of the back side thereof) and Cu balls and between Cu balls and the connection terminal on the substrate include Sn—Cu compounds and Sn—Ni compounds. Since the growth rate of the alloy layer is small, no problem of embrittlement occurs.

Embodiment 4

Figure 3:
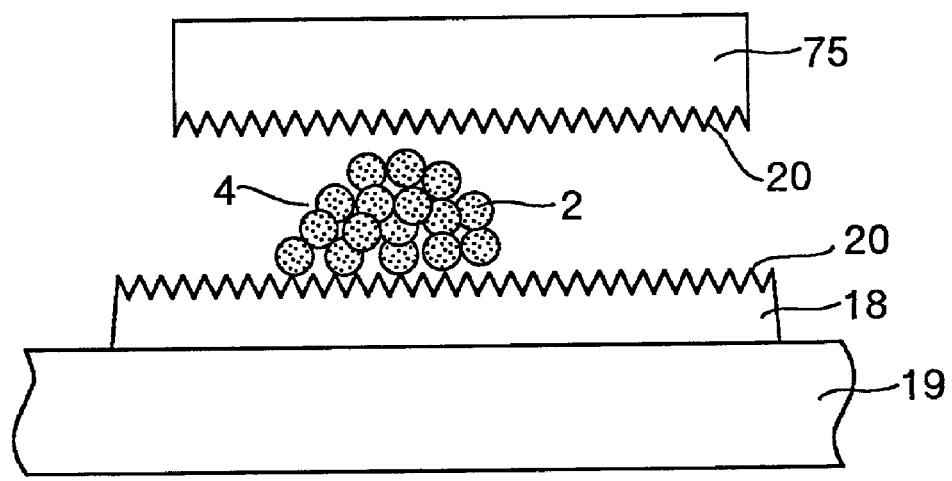
FIG. 3(a) and FIG. 3(b) are sectional views of a case where the invention is applied to a surface etching pattern.
Figure 3:
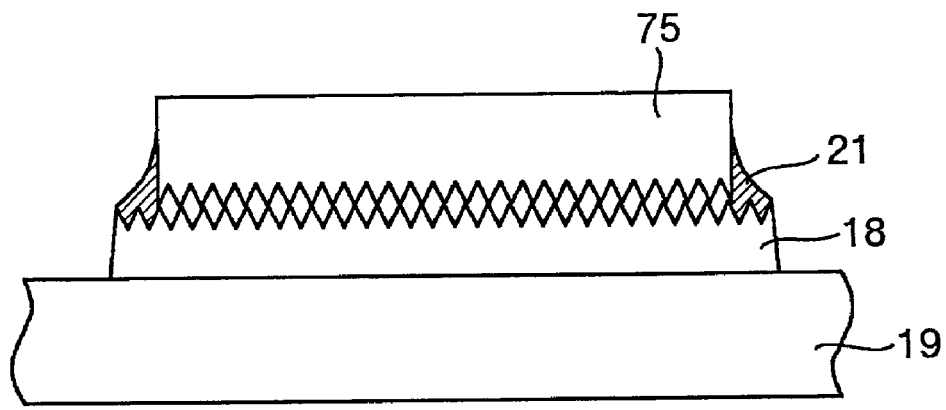

The junction provided by a high-temperature solder needs to withstand only during reflow which is performed in a succeeding step, and the stress applied to this junction during the reflow is thought to be small. Therefore, instead of using the metal balls, one side or both sides of each of connection terminals are roughened so that projections of Cu, Ni, etc. may be formed, whereby an alloy layer is formed surely at the contact portions of the projections and other portions are bonded with a solder. This provides the same effect as with the balls. The solder is applied to one of the terminals by means of a dispenser, the solder being then made to melt while the projections are made from the above to be forced to intrude into each other by means of a resistance heating body of pulsed electric current, whereby the die bonding is performed at a high temperature. As a result, because of the anchor effect of the projections and the formation of the compounds in the contact portions, the contact portions can obtain strength high enough to withstand the stress occurring during the reflow. FIG. 3(a) shows a model of the section of a junction in which the surface of a Cu pad 18 of a substrate 19 is roughened by etching and a paste of an Sn-base solder 2 is applied to the roughened surface. In this case, fine Cu particles, etc., may be added to the Sn-base solder. The back side of a terminal portion 75 of a part may be flat. In this case, however, it was plated with Cu or Ni, etc. and the surface thereof was roughened by etching 20. FIG. 3(*b*) shows a state of the bonding performed by heating under pressure. The compounds are formed in the contact portions by the reflow performed at a somewhat high temperature, so that the contact portion becomes strong in strength. Therefore, in the succeeding reflow step in which the external connection terminals are bonded to the terminals of the substrate, this portion is not exfoliated.

Embodiment 5

Figure 4:
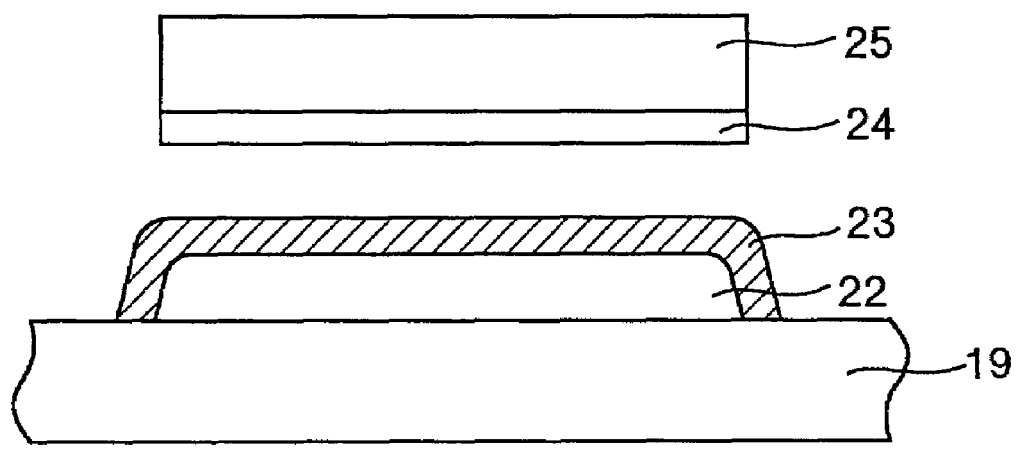
FIG. 4 is a sectional view before bonding in a case where the invention is applied to plating easily capable of alloying.

In bonding by use of Au—Sn alloys in which the amount of diffused elements is increased by aging and regarding which resultant compounds change in about three stages from a low-temperature to a high-melting point side, various compounds are formed at relatively low temperatures within a range of a small temperature variation. A well-known composition of the Au—Sn alloy is Au-20Sn (melting point: 280° C., eutectic type). The composition range of Sn in which the eutectic temperature of 280° C. is maintained is from about 10 to 37 mass % Sn. There occurs a tendency to become brittle when the Sn content thereof increases. It is deemed that a composition range which may be realized in an alloy containing Au of a low content is 55 to 70% Sn, and in this composition a 252° C.-phase comes to be present (Hansen; Constitution of Binary Alloys, McGRAW-HILL, 1958). Since the possibility that the temperature of a portion bonded in the preceding step (primary reflow) reaches 252° C. after the bonding in a succeeding step (secondary reflow) is thought to be low, it is thought that even in this composition range, the purpose of temperature-hierarchical bonding can be achieved. As regards the compositions, $AuSn_2$ and $AuSn_4$ are formed, which can be applied to the die bonding or to the encapsulation portion of the cap. For further extra safety, an Au—Sn alloy containing Sn of 50 to 55 mass % may be adopted, in which alloy the solidus line and the liquidus line thereof become 309° C. and maximum 370° C., respectively, so that it becomes possible to prevent the 252° C.-phase from occurring. FIG. 4 shows a model of a section in which the back side of an Si chip 25 is plated beforehand with Ni(2 μm)-Au (0.1 μm), for example, taps on a lead frame 19 being plated with Ni(2 μm)22-Sn(2–3 μm) 23. In the die bonding performed in a nitrogen atmosphere while heating under pressure and in the aging additionally applied as occasion required, a part of Sn is consumed to form the Ni—Sn alloy layer (, that is, the Ni—Sn compound layer) and the remainder of Sn forms an Au—Sn alloy phase. In a case where the Sn content is too high, a low eutectic point (217° C.) of Sn and $AuSn_4$ is formed. Therefore, it is necessary to control the Sn content so that this eutectic point may be not formed. Alternatively, a paste in which fine metal particles and Sn, etc., are mixed may be coated thereon. Because the die bonding by use of Au—Sn solders is performed at a high temperature of 350–380° C., it is possible to form a compound in which the Sn content is lower than that of the $AuSn_2$, by controlling the film thickness, temperature and a period of time, whereby the melting point thereof can be made to be not less than 252° C. Thus, it is thought that no problem occurs in the succeeding reflow step.

As mentioned above, by causing the solder to melt at 300° C. levels, which are considerably higher than the melting point of Sn, the diffusion of the elements was activated and the compound were formed, whereby the strength required at the high temperature was able to be ensured and the high-reliability bonding thereof on the higher-temperature side in the temperature-hierarchical bonding was able to be realized.

As regards the metal balls described above, there may be used any one of the balls of single-element metal (for example, Cu, Ag, Au, Al and Ni), the balls of alloy (for example, Cu alloy, Cu—Sn alloy and Ni—Sn alloy), the balls of compounds (for example, $Cu_6Sn_5$ compound) and the balls that contain mixtures of the above. In other words, there can be used any kind of substance in which compounds are formed with molten Sn so that the bonding between metal balls can be ensured. Therefore, metal balls are not limited to one type, and two or more types of metal balls may be mixed. These metal balls may be treated by Au plating, or Ni/Au plating, or single-element Sn plating, or alloy plating containing Sn. Further, resin balls whose surfaces are plated with one kind selected from Ni/Au, Ni/Sn, Ni/Cu/Sn, Cu/Ni and Cu/Ni/Au may be used. A stress relieving action can be expected from mixing the resin balls.

Embodiment 6

Next, there is described a case where Al balls are used as balls of other metals. In general, high-melting metals are hard, and pure Al is available as a metal that is inexpensive and soft. Pure Al (99.99%) usually does not wet Sn although it is soft (Hv 17). However, Sn can be readily wetted by plating the pure Al with Ni/Sn, Ni/Cu/Sn, etc. The pure Al readily diffuses at a high temperature in a vacuum. Therefore, by using Sn-base solders containing Ag under some bonding conditions, it is possible to form compounds with Al, etc., such as Al—Ag. In this case, the metallization of the Al surface is unnecessary and this provides a great cost merit. Trace amounts of Ag, Zn, Cu, Ni, etc. may be added to Sn so that Sn reacts readily with Al. The Al surface can be wetted either completely or in spots. When stress is applied in the latter case of spots-like wetting, because restraining from deforming becomes small insofar as a bonding strength is ensured, deformability is good and the unwetted portions absorb energy as friction loss. Therefore, a material excellent in deformability is obtained. It is also possible to plate an Al wire with Sn, Ni—Sn, Ag, etc. and cut it in particle forms. Al particles can be produced in large amounts at low cost by the atomization process, etc. in a nitrogen atmosphere. It is difficult to produce Al particles without surface oxidation. However, even when the surface is once oxidized, oxide films can be removed by the metallizing treatment.

Embodiment 7

Next, Au balls are described. In the case of the Au balls, Sn readily wets them and, therefore, metallizing is unnecessary insofar as bonding performed in a short time is concerned. However, in a case where the soldering time is long, Sn diffuses remarkably and there occurs such a fear as brittle Au—Sn compounds are caused. For this reason, in order to ensure a soft structure, In (, that is, indium) plating in which the degree of diffusion to Au is low, etc. is effective, and Ni, Ni—Au, and etc. used as a barrier are also effective. Forming a barrier layer that is made to be as thin as possible makes Au balls readily deformable. Alternatively, other metallized structures may also be adopted insofar as they can suppress the growth of an alloy layer with Au. When the bonding is performed in a short time in the die bonding, an alloy layer formed at grain boundaries is thin in thickness, so that the effect brought about by the flexibility of Au can be greatly expected even in a case where no barrier is provided. The combination of the Au balls and In solder balls is also possible.

Embodiment 8

Next, Ag balls are described. The case of the Ag balls is also similar to that of the Cu balls. Since the mechanical properties of $Ag_3Sn$ compounds such as hardness and etc. are not poor, so that it is also possible to perform the bonding of the Ag particles together through the compounds by a usual process. It is also possible that Ag balls are mixed in Cu, etc.

Embodiment 9

Next, there is described a case where a metal material are used as metal balls. As representative alloy-base materials, Zn—Al-base and Au—Sn-base materials are available. The melting point of a Zn—Al-base solder are mainly in the range from 330° C. to 370° C., which are suitable for performing the hierarchical bonding with a Sn—Ag—Cu-base solder, a Sn—Ag-base solder and a Sn—Cu-base solder. As representative examples of the Zn—Al-base solder, there are available a Zn—Al—Mg-base solder, a Zn—Al—Mg—Ga-base solder, a Zn—Al—Ge-base solder, a Zn—Al—Mg—Ge-base solder, and any one of these solders that contains at least one kind selected from Sn, In, Ag, Cu, Au, Ni, and etc. In the case of the Zn—Al-base solder, the oxidation thereof occurs intensively and the solder rigidity thereof is high. For these reasons, it is pointed out that cracks may occur in Si chips when Si is bonded (Shimizu et al.: "Zn—Al—Mg—Ga Alloys for Pb-Free Solders for Die Attachment," Mate 99, 1992-2). Thus, these problems must be solved when the Zn—Al-base solder is used as metal balls.

Accordingly, in order to solve these problems, that is, in order to lower the rigidity of the solders, heat-resistant plastic balls plated with Ni/solder, or Ni/Cu/solder, or Ni/Ag/solder or Au were uniformly dispersed in the Zn—Al-base balls to thereby lower Young's modulus. It is preferred that each of these dispersed particles be smaller in size than that of the Zn—Al-base balls and be uniformly dispersed in the Zn—Al-base balls. At the time of the deformation, the soft plastic balls with elasticity having a size of about 1 µm deform, so that there is brought about a great effect on the relieving of thermal impact and mechanical impact. When a rubber is dispersed in the Zn—Al-base solder balls, the Young's modulus decreases. Since the plastic balls are almost uniformly located among the Zn—Al-base solder balls, this dispersion is not greatly varied during the melting performed in a short time. Further, by using plastic balls whose thermal decomposition temperature is about 400° C., the organic substances thereof can be prevented from being decomposed in the solder during the bonding performed through the resistance heating body.

The Zn—Al is apt to be readily oxidized. Thus, in taking the storage thereof and etc. into consideration, it is preferred that the surface thereof be plated with Sn formed by replacing Cu. The Sn and Cu dissolve during the bonding in the Zn—Al solder insofar as a low amount of Sn and Cu is concerned. Because of the presence of Sn on the surface, it become easy to perform, for example, the bonding onto an Ni/Au plating formed on a Cu stem. At such a high temperature as to be not less than 200° C., the growth rate of an Ni—Sn alloy layer ($Ni_3Sn_4$) is larger than that of $Cu_6Sn_5$, so that there occurs no phenomenon that the bonding were impossible due to insufficient formation of the compounds.

Further, by making the Sn balls of 5–50% mixed therein in addition to the plastic balls, Sn layers come to be located among the Zn—Al-base solders. In this case, a part of the Zn—Al balls are bonded directly to each other, however, in the other portions, relatively soft Sn—Zn phase of a low melting point and remaining Sn and etc. come to be present, so that any deformation can be absorbed by the Sn, the Sn—Zn phase and the rubber of the plastic balls. In particular, because of a combined action of the plastic balls and the Sn layers, further relieving of the rigidity can be expected. Even in this case, the solidus line temperatures of the Zn—Al-base solder is ensured to be not less than 280° C., so that there is no problem regarding the strength required at high temperatures.

By plating the Zn—Al-base solder balls with Sn so that Sn phase which remains without being dissolved in the balls may be present, the Sn phase acts to absorb the deformation, so that the rigidity of the Zn—Al solder balls can be relieved. In order to further relieving the rigidity, the Zn—Al-base solder balls may be used while mixing therein plastic balls having a size of about 1 µm which are coated by metallizing and soldering, so that the impact resistance thereof is improved and the Young's modulus thereof decreases. Alternatively, by using a paste in which the balls of Sn, In, etc. and the rubber of the Sn-plated plastic balls are dispersed in the Zn—Al-base (for example, Zn—Al—Mg, Zn—Al—Ge, Zn—Al—Mg—Ge and Zn—Al—Mg—Ga) solder balls, it is possible to similarly improve temperature cycle resistance and impact resistance, whereby the high reliability thereof can be ensured. When only the Zn—Al-base solders are used, the balls are hard (about Hv 120–160) and the rigidity is large, so that there occurs such a fear as a Si chip of a large size is broken. For removing this fear, the layers of soft, low-meling point Sn and In are made to be present around the balls, and the rubber is dispersed among the balls, whereby the deformability is ensured and the rigidity decreases.

Embodiment 10

Figure 5:
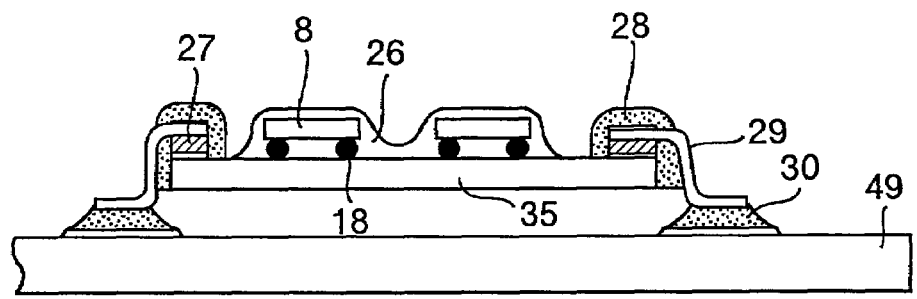
FIG. 5(a) to FIG. 5(c) are sectional views of a model in which a module is mounted on a printed circuit board.
Figure 5:
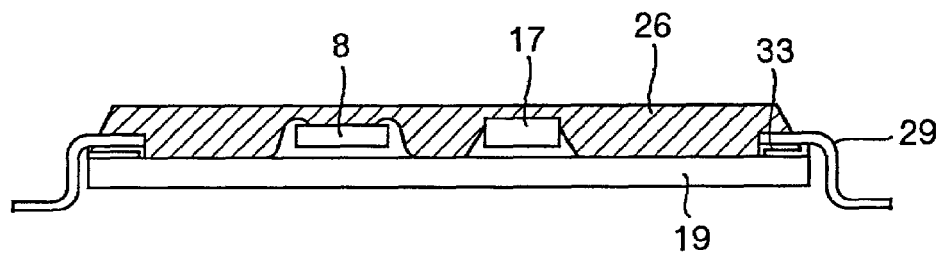
Figure 5:
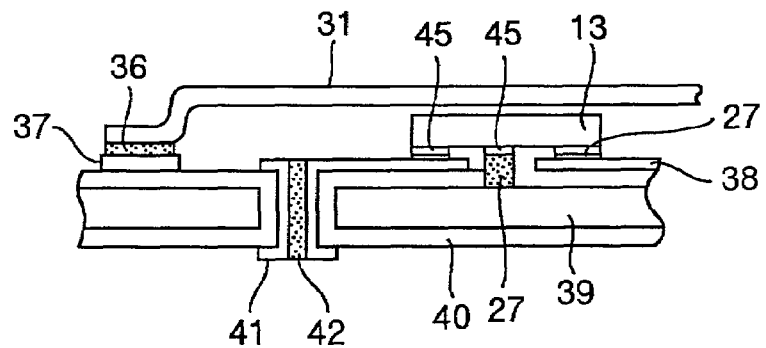

FIG. 5(a) to FIG. 5(c) show an example in which a relatively small output module and etc. used for signal-processing in portable cellular phones, which module has such a large square shape as one side thereof is larger than 15 mm in length, are mounted to a printed circuit board by a flat pack type package structure in which a difference in thermal expansion coefficient between the module and the substrate is relieved by leads. In this type of structure, it is usual to adopt the system that the rear face of each of circuit elements is die-bonded to a junction substrate excellent in thermal conductivity and they are connected to the terminal of the junction substrate by wire bonding. Regarding this system, there are many examples in which a MCM (multi chip module) design is adopted in which there are located several chips and chip parts such as of resistors and capacitors arranged around each of the chips. A conventional HIC (hybrid IC), power MOSIC, etc., are the representative examples thereof. As an available module substrate, there are Si thin-film substrate, an AlN substrate having a low thermal expansion coefficient and a high thermal conductivity, a glass ceramic substrate of a low thermal expansion coefficient, an $Al_2O_3$ substrate whose coefficient of thermal expansion is close to that of GaAs, and a metal-core organic substrate of Cu, etc., which has high heat resistance and improved thermal conduction.

FIG. 5(a) shows an example in which Si chips 8 are mounted on an Si substrate 35. Since resistors, capacitors, etc., can be formed in thin films on the Si substrate 35, higher-density mounting is possible. In this example, a flip chip mounting structure of the Si chips 8 is shown. It is also possible to adopt such a system as Si chips are bonded by die bonding while the terminals are connected by wire bonding. FIG. 5(b) shows another example in which the mounting on the printed circuit board 49 is of a QFP-LSI type module structure and soft Cu-base leads 29 are adopted. It is general to perform the metallizing on the Cu leads 29 by Ni/Pd, Ni/Pd/Au, Ni/Sn, and etc. The bonding of the leads 29 and an Si substrate 35 is performed by heating under pressure by use of the paste relating to the invention. As regards the leads, it is possible to adopt a method in which the leads are supplied as a row of a straight line by means of a dispenser or in which the supply of the material thereof is performed by printing regarding each of the terminals and the leads are formed by performing the separating thereof regarding individual terminals through the heating under pressure. The Au or Cu bumps 18 of each of the Si chips are bonded by supplying the paste relating to the invention to the junction substrate 35. Alternatively, it is possible to perform the Au—Sn bonding or Cu—Sn bonding by plating with Sn the terminals located on the substrate side. Furthermore, as still another bonding method, in a case where Au ball bumps are used while Sn-plated terminals are provided on the substrate, the Au—Sn bonding is obtained by a thermocompression bonding technique, so that resultant junctions come to adequately withstand a reflow temperature of 250° C. Further, it is also possible to use a heat-resistant, electrically conductive paste. For the protection of the chips there is provided on each of the chips a silicone gel 26, or an epoxy resin containing a filler and/or a rubber such as a silicone which epoxy resin has a low thermal expansion coefficient and flexibility of a certain level while maintaining a flowability and a mechanical strength after setting, or a silicone resin, thereby making it possible to protect and reinforce the chips including the terminal portions of the leads. This enables lead-free bonding by the temperature hierarchy, the realization of which has been desired.

In a case where there is used a thick film substrate such as an AlN substrate, a glass ceramic substrate or an $Al_2O_3$ substrate instead of using the Si substrate, the mounting of the resistors, capacitors, etc. as the parts of the chips becomes basic. Further, there is available a forming method in which laser trimming is performed while using a thick-film paste. In the case of resistors and capacitors formed by the thick-film paste, it is possible to adopt the same mounting system as in the above Si substrate.

FIG. 5(b) shows another system comprising the steps of mounting the chips 8 of Si or GaAs, with its face up, on an $Al_2O_3$ substrate 19 excellent in thermal conductivity and in mechanical properties, performing the bonding thereof under pressure by means of a pulse resistance heating body, performing the reflow bonding of chip parts, performing the cleaning thereof, and performing the wire bonding. In this case, resin encapsulation is a general practice similarly to the case of FIG. 5(a). The resin used therein is, similarly to the case of FIG. 5(a), an epoxy resin of low thermal expansion coefficient in which a quartz filler and rubber such as a silicone rubber are dispersed and which can reduce thermal impacts, or a silicone resin, or a resin in which the two of the resins are mixed in some states or forms. In this system, a large substrate of an undivided state is used insofar as the mounting of the chips and the chip parts are concerned, and the large substrate is divided thereafter, and each of the divided portions is covered with a resin after the lead bonding. The coefficients of thermal expansion of GaAs and $Al_2O_3$ are close to each other, the paste solder of the invention containing about 50% Cu, and besides the bonding is preformed through the structure of the bonded Cu particles, so that there is obtained a structure having excellent thermal conductivity. To further improve the heat dissipation, thermal vias are provided under the metallized layer formed immediately under the chip, thereby making it possible to also dissipate heat from the back side of the substrate. The supply of the paste relating to the invention to these terminals is performed by printing or by means of the dispenser. The paste relating to the invention can be also used in solder junctions 33 that provides bonding between the lead 29 and the $Al_2O_3$ substrate 19.

In the case of the bonding of Al fins, if a non-cleaning type is possible, there is available a system comprising the steps of supplying the paste in a shape surrounding the fins by means of a dispenser or printing, and performing the bonding under pressure by means of the resistance heating body or a laser or a light beam etc. or bonding by one operation simultaneously with the chip parts by the reflow. In the case of Al materials, plating with Ni, etc. is performed as metallizing. In the case of the fin bonding, in order to realize the non-cleaning type, Al is worked to be in a foil shape and the foil thus obtained is bonded under pressure in an $N_2$ atmosphere by means of the resistance heating body.

FIG. 5(c) shows a part of a module structure in which electronic parts are mounted on a metal-core substrate having a metal 39 therein and are encapsulated with an Al fin 31. A chip 13 may have a face-down structure and may be directly bonded to the metal 39 of the metal core by installing dummy terminals 45 for heat dissipation. The bonding is performed by LGA (lead grid array) system, the pads of a chip-side being made of Ni/Au or Ag—Pt/Ni/Au, the pads of a substrate-side being made of Cu/Ni/Au, and these are bonded to each other by use of the paste relating to the invention. In a case of using a polyimide substrate that has a low thermal expansion and a heat resisting property or using a built-up substrate having similarly thereto a heat resisting property, the module mounting with the temperature hierarchy can be performed in which the semiconductor devices 13 are directly mounted by use of a paste 36 relating to the invention. In the case of a chip of high heat generation, it is also possible that the heat is conducted to the metal 39 through the thermal vias. Since in each of the thermal vias Cu particles contact with each other are present, the heat is instantaneously conducted to the metal, that is, this structure is excellent in thermal conductivity. In this case, also regarding the portions where the cap 31 is bonded, the bonding is performed by use of the paste 31 relating to the invention. The paste portions 36 can be printed in one operation.

As an example of applying the embodiment to a circuit element, the RF module was described above, however, the invention can also be applied to any one of an SAW (surface acoustic wave) device structure used as a band pass filter for various types of mobile communication equipments, a PA (high-frequency power amplifier) module, a module for moitoring a lithium cell, and other modules and circuit elements. As regards the product field in which the solder of the invention can be applied is not limited to portable cellular phones including mobile products, nor to notebook personal computers, etc. and can be applied to module-mounting parts capable of being used in new household appliances, etc. in the digitization age. Needless to say, the solder relating to the invention can be used for the temperature-hierarchical bonding by use of a Pb-free solder.

Embodiment 11

Figure 6:
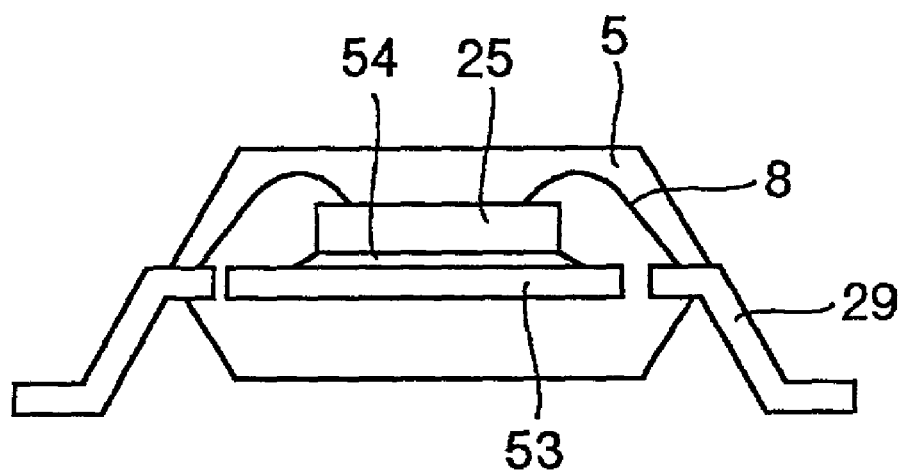
FIG. 6 is a sectional view of a model of plastic package.

FIG. 6 shows an example of the application of the invention to a usual plastic package. Conventionally, the rear face of an Si chip 25 is bonded to a tab 53 of 42Alloy by use of an electrically-conductive paste 54. The circuit element is connected to each of leads 29 by wire bonding while using a gold wire 8, etc. and is molded with a resin 5. After that, the leads are plated with Sn-based solder corresponded to the Pb-free bonding design. Conventionally, a eutectic Sn-37Pb solder with a melting point of 183° C. was able to be used for the mounting on a printed circuit board and, therefore, it was possible to perform the reflow bonding at 220° C. maximum. However, in the case of the Pb-free bonding, since the reflow bonding is performed by use of the Sn-3Ag-0.5Cu solder (melting point: 217–221° C.), the reflow temperature becomes about 240° C., that is, the maximum temperature becomes higher by about 20° C. than that of the conventional technique. Thus, insofar as a conventionally used heat-resistant, electrically-conductive paste used for the bonding between the Si chip 25 and the tab 53 of 42-Alloy is concerned, the bonding strength at the high temperature decreases, and there occurs such a fear as the reliability thereof is affect. Therefore, by using the paste relating to the invention in place of the electrically-conductive paste, it becomes possible to perform the Pb-free bonding at about 290° C. with respect to the die bonding. This application to a plastic package can be applied in all plastic package structures in which an Si chip and a tab are bonded together. As for the shape of the leads, structurally there are the gull wing type, the flat type, the J-lead type, the butt-lead type and the leadless type. It is needless to say that the invention can be applied to all of the types.

Embodiment 12

Figure 7:
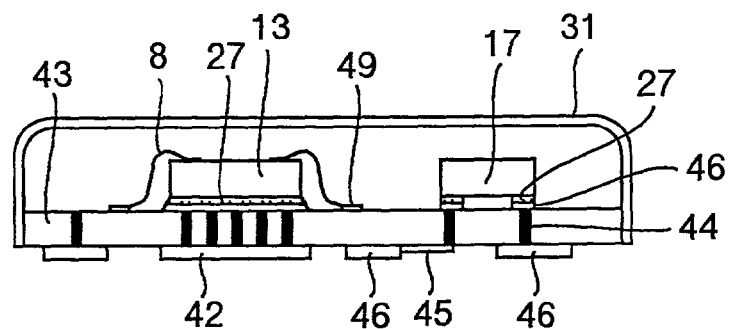
FIG. 7(a) to 7(c) are sectional views of a model of mounting an RF module.
Figure 7:
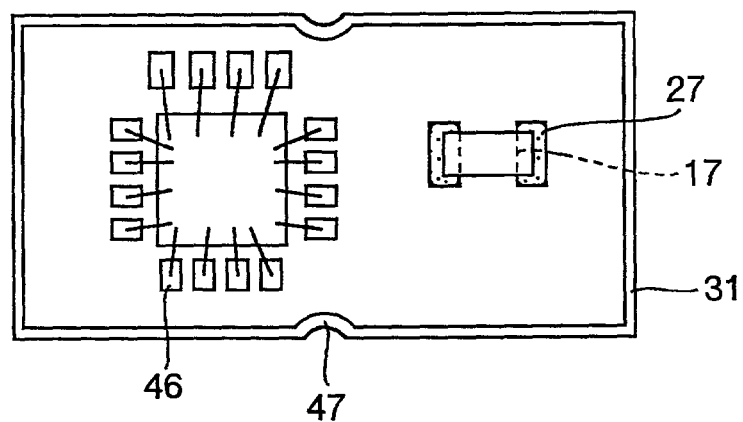
Figure 7:
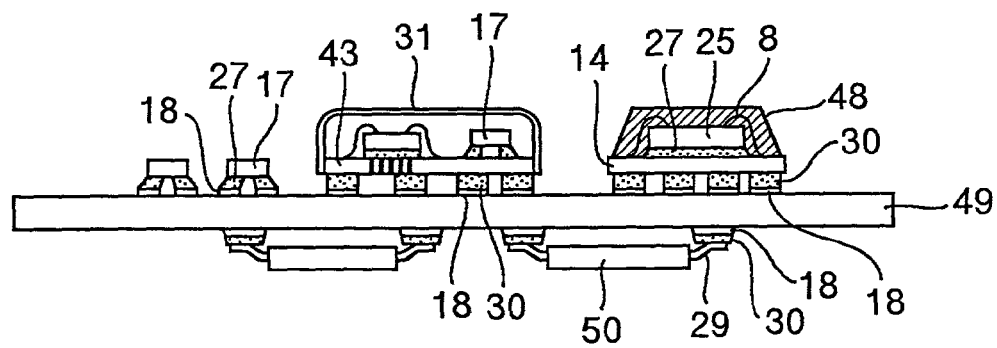

FIG. 7(a) to FIG. 7(c) show more specific examples in which the invention is applied to the mounting of RF modules for high frequencies. FIG. 7(a) is a sectional view of the module and FIG. 7(b) is a plan view of the module in which an Al fin 31 on the top face is removed.

In an actual structure, several MOSFET elements each comprising a chip 13 with a size of 1×1.5 mm which generates radio waves are mounted with face-up bonding in order to adapt to multi-band design, and besides there is formed, by parts 17 such as resistors and capacitors, around the MOSFET parts a high-frequency circuit for efficiently generating the radio waves. Chip parts are also miniaturized and 1005, 0603, etc., are used. The module is about 7 mm long and about 14 mm wide and is miniaturized with high-density mounting.

In this embodiment, only the functional aspect of the solder is taken into consideration, and there is described a model in which one circuit element and one chip are mounted as the representatives thereof. In this case, as described hereinbelow, the chip 13 and circuit element 17 are bonded to a substrate 43 by the solder paste relating to the invention. The terminals of the Si (or GaAs) chip 13 are bonded to the pads of the substrate 43 by wire bonding 8, and in addition are electrically connected, via through holes 44 and interconnector 45, to terminals 46 that provide the external connection on the rear face of the substrate. The chip part 17 is solder-bonded to the pads of the substrate and is further electrically connected, via the through holes 44 and the interconnector 45, to the terminals 46 that provide the external connection on the rear face of the substrate. The chip 13 is often coated with a silicone gel (omitted in this figure). Under the chip 13 are provided thermal vias 44 for heat dissipation, which are guided to a terminal 42 for heat dissipation on the rear face. In the case of a ceramic substrate, the thermal vias are filled with a thick-film paste of a Cu-base material excellent in thermal conductivity. When an organic substrate that is relatively inferior in heat resistance is used, by using the paste relating to the invention it is possible to perform the soldering in the range of 250° C. to 290° C. for the bonding of the rear face of the chip, the bonding of the chip parts, and in the thermal vias etc. Furthermore, the Al fin 31 covering the whole module and the substrate 43 are fixed together by caulking, etc. This module is mounted by solder-bonding the terminals 46, that provide an external connection, to a printed circuit board, etc., and in this case the temperature-hierarchical bonding is required.

FIG. 7(c) shows an example in which, besides this FR module, a semiconductor device of BGA type and a chip part 17 are mounted on a printed circuit board 49. In the semiconductor device, a semiconductor chip 25 is bonded, in a face-up state, to a junction substrate 14 by use of the solder paste relating to the invention, the terminals of the semiconductor chip 25 and the terminals of the junction substrate 14 being bonded together by wire bonding, and the areas around the bonding portions are resin-encapsulated. For example, the semiconductor chip 25 is die-bonded to the junction substrate 14 through the resistance heating body by melting the solder paste at 290° C. for 5 seconds. Further, on the rear face of the junction substrate 14 is formed solder ball terminals 30. For example, a Sn-3Ag-0.5Cu solder is used in the solder ball terminals 30. Moreover, also to the rear face of the substrate 49 is solder-bonded a semiconductor device (in this example, TSOP-LSI), which is an example of so-called double-sided mounting.

As a method of the double-sided mounting, for example, a Sn-3Ag-0.5Cu solder paste is first printed in pad portions 18 on the substrate 49. Then, to perform solder bonding from the side of the mounting face of a semiconductor device such as TSOP-LSI50, TSOP-LSI50 is located and the reflow bonding thereof is performed at 240° C. maximum. Next, chip parts, a module and a semiconductor are located and the reflow bonding thereof is performed at 240° C. maximum, whereby double-sided mounting is realized. It is usual to first perform the reflow bonding regarding light parts having heat resistance and then to perform the bond of heavy parts that have no heat resistance, as in this case of the above example. In performing the reflow bonding at a later stage, it is necessary that the solder of the first bonded parts be not allowed to fall, and it is ideal to prevent the solder from being re-melted.

In the case of the reflow and the double-sided mounting by the reflow, there occurs such a case as the temperature of the joints already mounted on the rear face exceeds the melting point of the solder. However, in most cases, there is no problem in case the mounted parts do not fall. In the case of the reflow, the temperature difference between the upper and lower faces of the substrate is small, so that the warp of the substrate is small and light parts do not fall because of the action of the surface tension even if the solder is melted. Although the combination of the Cu balls and Sn was described above in the representative examples relating to the invention, it is needless to say that the invention similarly applies to other combinations recited in the claims.

Embodiment 13

Next, to further reduce the cost of a RF module, a resin encapsulation method by the paste relating to the invention is described below.

FIG. 8(a) shows the RF module assembling steps of the resin encapsulation method and FIG. 8(b) shows the secondary mounting and assembling steps for mounting a module on a printed circuit board. FIG. 9(a) to FIG. 9(d) are sectional model drawings in which the sequence of assembling in the RF module assembling steps of FIG. 8(a) is shown. The size of an $Al_2O_3$ multilayer ceramic substrate 43 of a square shape is as large as 100 to 150 mm in one side, and the $Al_2O_3$ multilayer ceramic substrate 43 is provided with slits 62 for break so that it can be divided to each of module substrates. Cavities 61 are formed in the position where each of Si chips 13 on the $Al_2O_3$ multilayer ceramic substrate 43 is to be die-bonded, and each of the surfaces of the cavities 61 is plated with a thick-Cu-film/Ni/Au or Ag—Pi/Ni/Au. Just under the die-bond are formed a plurality of thermal vias (filled with Cu thick-film conductors, etc.) 44, which are connected to pads 45 formed on the back side of the substrate to thereby dissipate heat through a multilayer printed circuit board 49 (FIG. 9(*d*)). This enables the heat occurring from a high-output chip of several watts to be smoothly dissipated. An Ag—Pt thick-film conductor was used to form the pads of the $Al_2O_3$ multilayer substrate 43. Alternatively, a Cu thick-film conductor may be used in dependence on the type and fabrication method of a junction substrate (made of $Al_2O_3$ in this example), or it is possible to use a W—Ni conductor or Ag—Pd conductor. The pad portions in each of which a chip part is mounted are made of the plating of thick-Ag—Pt-film/Ni/Au. As regards the pads formed in the rear face of the Si chip, the thin film of the Ti/Ni/Au is used in this example, however, the pads are not limited to this structure, and such a thin film of Cr/Ni/Au etc. as to be usually used can be also used.

Figure 9:
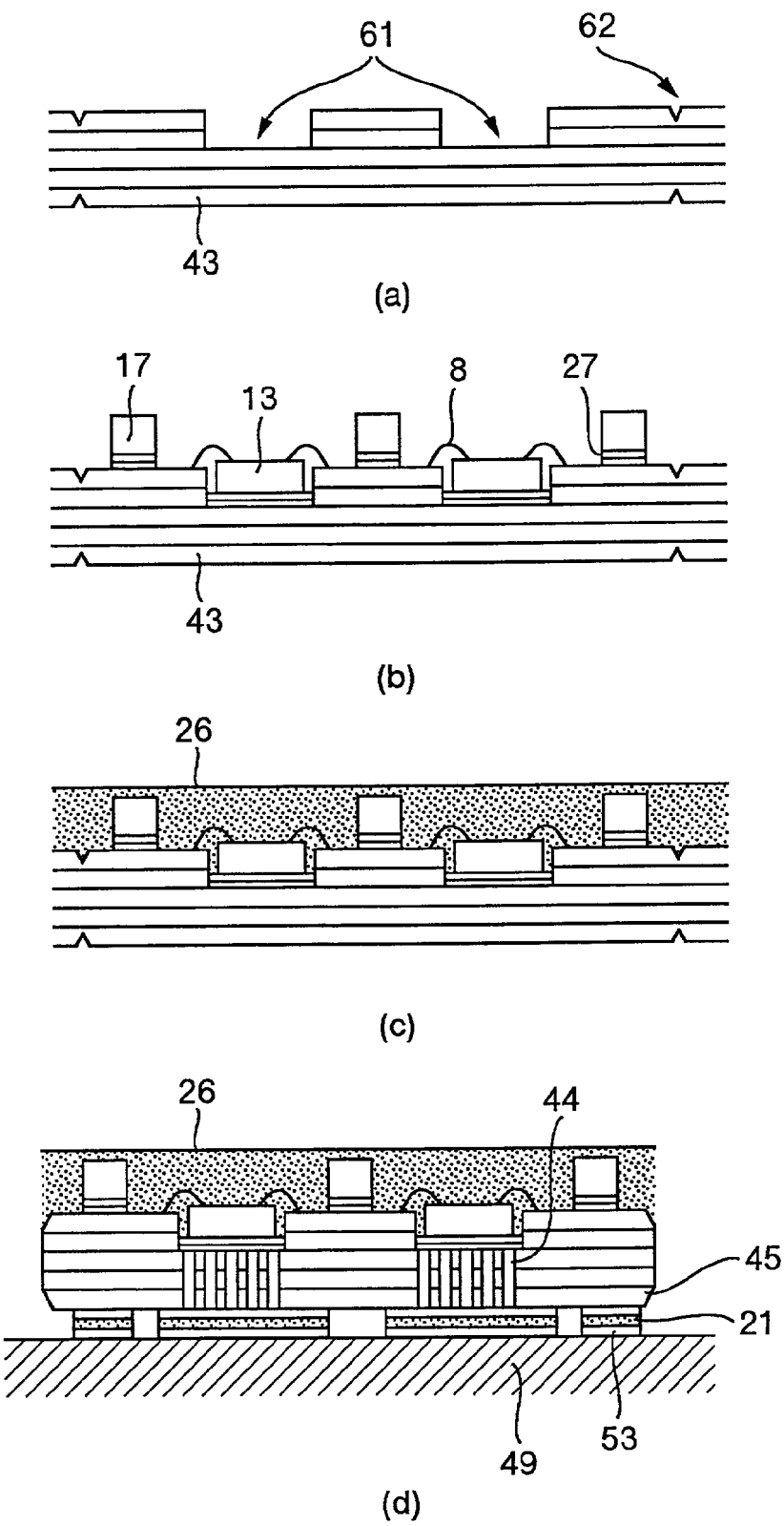
FIG. 9(a) to FIG. 9(d) are sectional views of a model of process sequence of an RF module.
Figure 10:
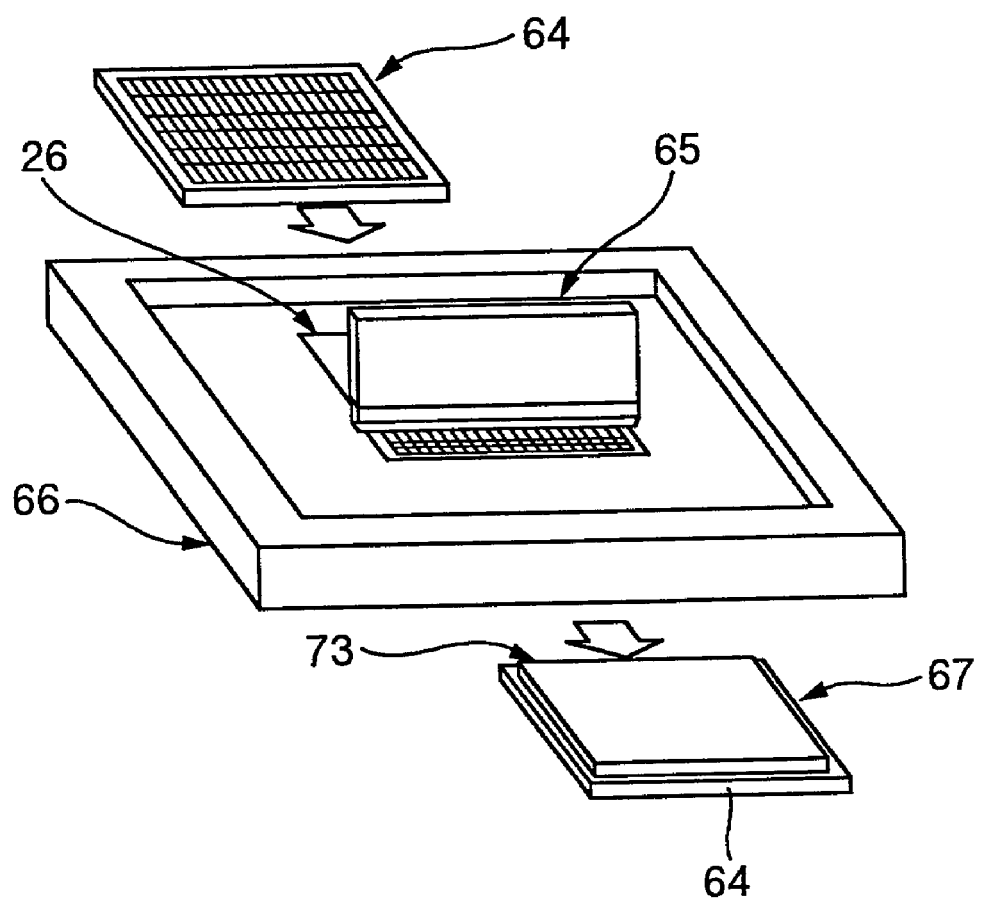
FIG. 10 is a perspective view of the mounting state of an RF module on a mounting substrate.
Figure 11:
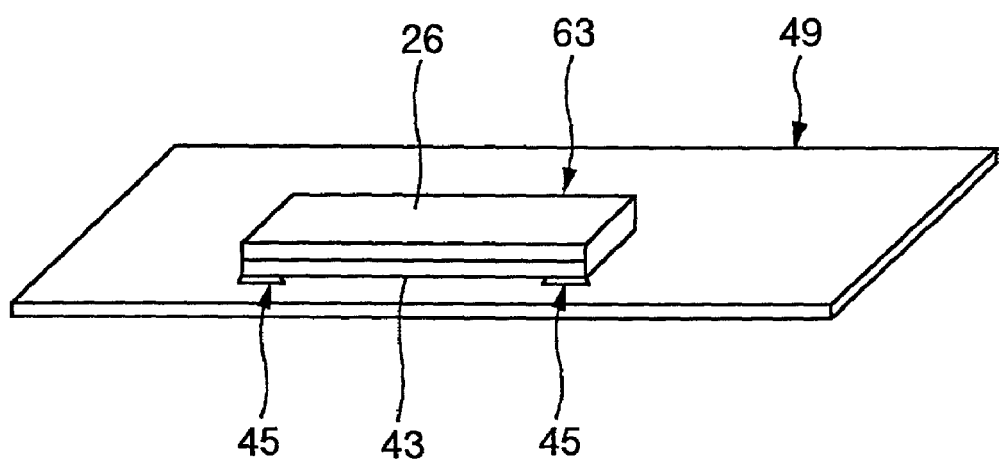
FIG. 11 is a perspective view of a method of resin printing in the assembling of an RF module.

After the die bonding of the Si chip 13 and the reflow of a chip part 17 (which will be described later in detail), wire bonding 8 is performed after the cleaning of the $Al_2O_3$ multilayer substrate (FIG. 9(*b*)). Further, a resin is supplied thereto by printing and a section shown in FIG. 9(*c*) is obtained. The resin, which is a silicone resin or low-elasticity epoxy resin, is printed by means of a squeegee 64, as shown in FIG. 10, so as to cover the $Al_2O_3$ multilayer substrate 43 with the resin by one operation, whereby a single-operation encapusulated portion 73 is formed on the $Al_2O_3$ multilayer substrate 43. After the setting of the resin, identification marks are put by a laser, etc. and a characteristics check is conducted after the dividing of the substrate. FIG. 11 is a perspective view of a module which was completed by the steps of dividing the $Al_2O_3$ multilayer substrate, mounting it on a printed circuit board and performing the reflow thereof. The module is made to have a LGA structure, so that it becomes possible to perform a high-density mounting on a printed circuit board.

Figure 8:
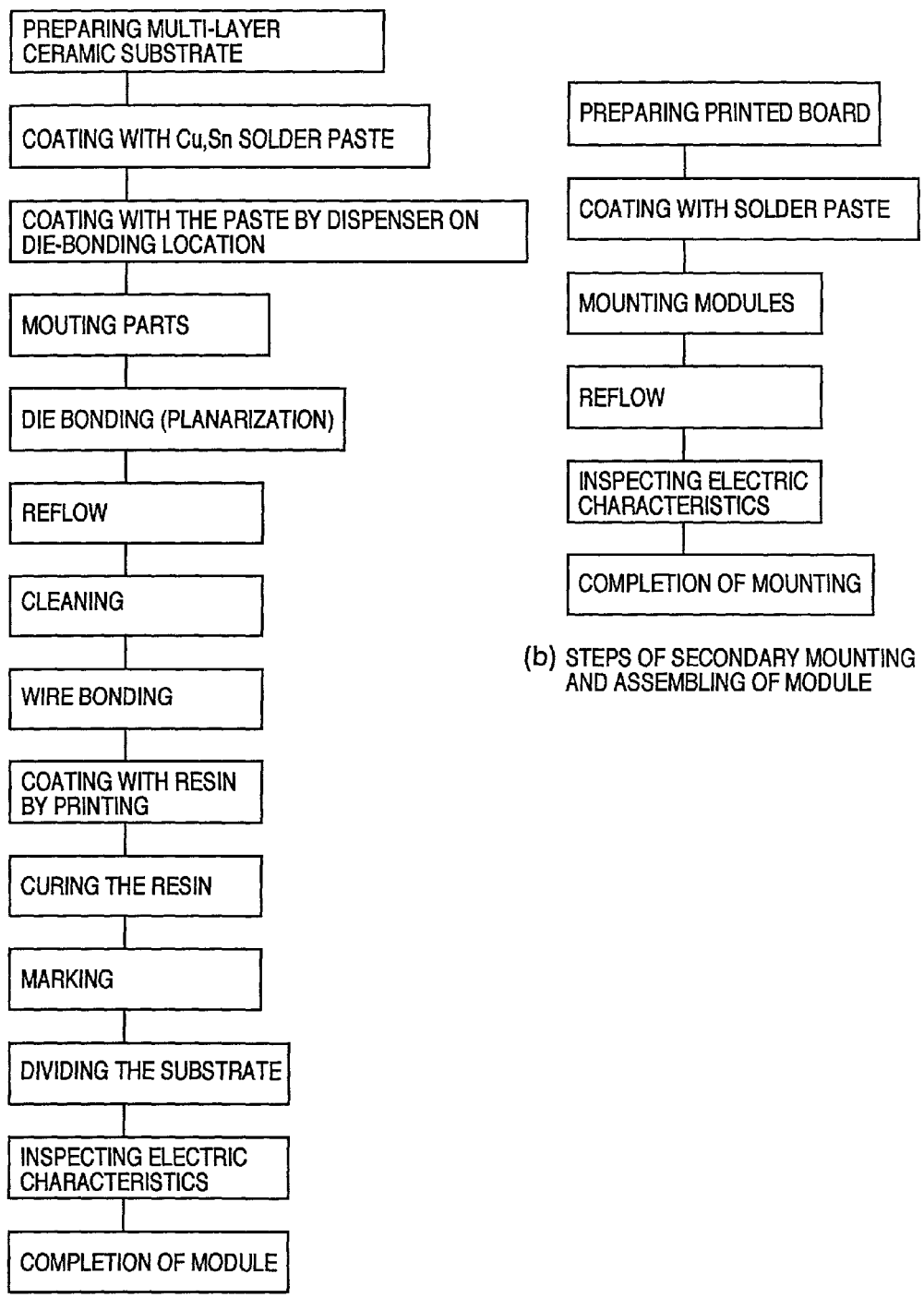
FIG. 8(a) and FIG. 8(b) are process flow charts of RF module mounting.

Next, the above description is supplemented by referring to the sequence of steps of the RF module assembling shown in FIG. 8(*a*). The paste relating to the invention is supplied to the chip part by printing, and this paste is supplied by means of a dispenser with respect to the chips to be mounted on the cavities. First, passive devices 17 such as chip resistors and chip capacitors etc. are mounted. Next, the 1×1.5-mm chip 13 is mounted and, at the same time, the die bonding thereof is performed by lightly and uniformly pressing the Si chip by means of a heating body at 290° C. to thereby perform the planarization thereof. The die bonding of the Si chip and the reflow of the chip parts are performed in a series of steps mainly by the heating body located under the $Al_2O_3$ multilayer substrate. To eliminate voids, Sn-plated Cu balls were used. At 290° C., the Cu balls soften a little and Sn improves fluidity at the high temperatures, thereby activating the reaction between Cu and Ni. In this case, the compound is formed in contact portions where Cu particles are in contact with each other and where Cu particles and metallized portions are in contact with each other. Once the compounds are formed, they do not re-melt even at the reflow temperature of 250° C. because of their high melting points. Further, because the die bonding temperature is higher than the secondary reflow temperature, Sn wets and spreads out sufficiently to thereby becomes the compound. As the result thereof, during the secondary reflow, the compound layers come to provide a sufficient strength at the high temperatures, so that the Si does not move even in the resin-encapsulated structure. Further, even in a case where the low-melting point Sn remelts, it does not flow out because it has already been subjected to the heat history of the higher temperatures. For these reasons, the Si chip remains stationary during the secondary reflow, so that the module characteristics are not affected by the re-melting of Sn.

Next, there are below described influences caused by the resin while comparing the case of the paste relating to the invention with that of conventional the Pb-base solder (which makes it possible to perform the reflow at 290° C.

Figure 12:
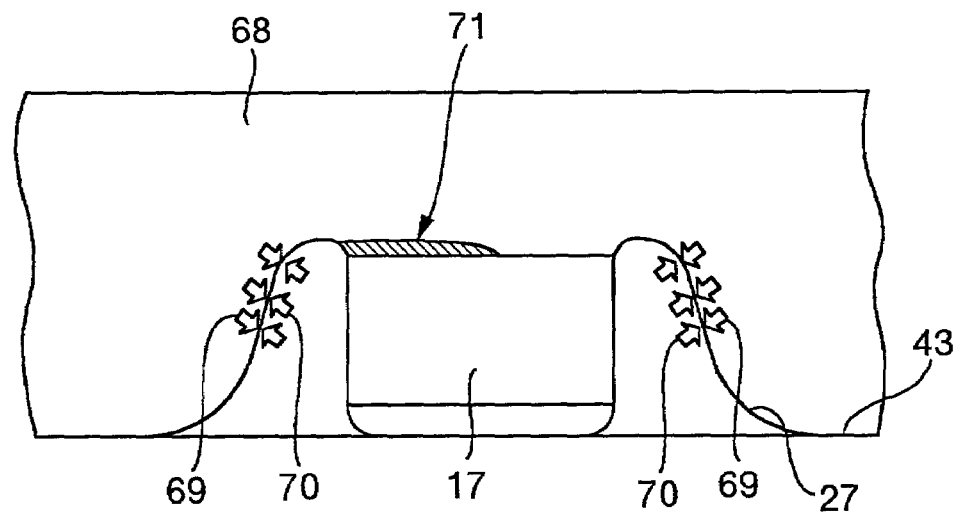
FIG. 12(a) and FIG. 12(b) are a sectional view and a perspective view, respectively, of the principle of solder flow in a comparative example of RF module.
Figure 12:
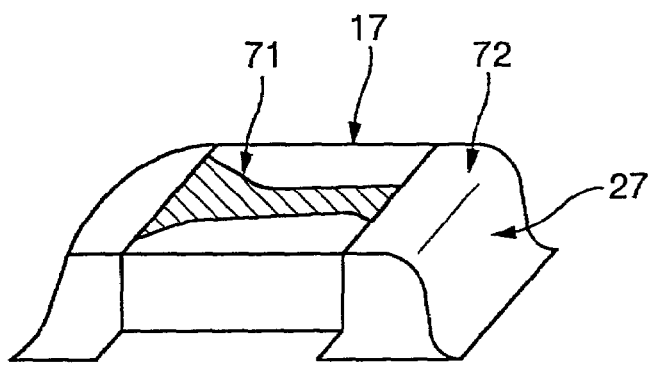

In FIG. 12(*a*) and FIG. 12(*b*) there is shown a model of a phenomenon of a short circuit caused in a chip part 17 by the flowing-out 71 of a conventional Pb base solder (having a solidus line temperature of 245° C.) in a case where the secondary reflow (220° C.) for peforming the bonding to a printed circuit board is performed (, which is similar to the mounting state of FIG. 11 and the composition of the solder 30 is a Sn—Pb eutectic). In a case of the module encapsulated by a filler-containing, high-elasticity epoxy resin 68 (, that is, in the case of a chip part plated with Sn or Sn—Pb, which is usually used for metallizing, the melting point at which this solder remelts decreases to about 180° C. because of the formation of a eutectic phase of the Sn—Pb, the circuit short caused under the pressure of this resin by using of the modulus of elasticity of the resin at 180° C. at which the solder flows out is 1000 MPa. Although the melting point of the Pb-base solder is originally the solidus line temperature of 245° C., it decreases to about 180° C. because the pads of the chip part are plated with the Sn—Pb solder and because the substrate side is plated with Au. Therefore, the Pb-base solder is in a remolten state during the secondary reflow (220° C.). When the Pb-base solder changes from the sold to the liquid, a volume expansion of 3.6% occurs abruptly in the solder. Both of the remelting expansion pressure 70 of the Pb-base solder that forms a fillet on the side of the chip part and the resin pressure 69 balance with each other with large stress and exfoliate the interface formed between the top surface of the chip and the resin, which is a structurally weak portion, causing the solder to flow out. As the result, the short circuits to the pads on the opposite side occurred at a high probability (70%). It is also found that the incidence of this short-circuit phenomenon can be lowered by the lowering of the modulus of elasticity of a resin defined at a high temperature (180° C.). Since there is a limit as regards the softening of epoxy resins, the research was made while raising the modulus of elasticity by adding a filler, etc. to a soft silicone resin. As the result, it is found that the outflow of the solder will not occur when the elastic modulus at 180° C. is not more than 10 MPa. When the modulus of elasticity was increased to 200 MPa at 180° C., short circuits occurred at the probability of 2%. In view of the foregoing, it is necessary that, in a solder structure which remelts, the modulus of elasticity of the resin be not more than 200 MPa at 180° C.

Figure 13:
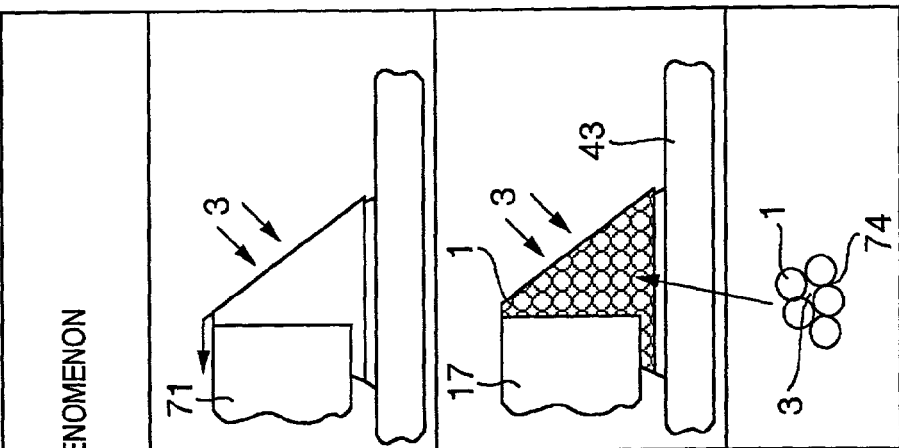
FIG. 13 shows a comparison of the phenomena of RF module between a comparative example and a example relating to the invention.

Then, the influence caused by the outflow regarding the paste structure of the present invention is shown in FIG. 13 while comparing it with a conventional solder. As described above, when bonding is performed by use of the paste relating to the invention, the volume occupied by the Sn in the molten portion is about a half and, partly because the expansion value of Sn itself is small, the volume expansion ratio of the solder becomes 1.4%, which is 1/2.6 as low as that of the Pb-base solder. Further, as illustrated by the model shown in FIG. 13, the Cu particles are bonded together in a point-contact state, the pressure of the resin is balanced by the reaction of the Cu particles even at the time of the melting of Sn, so that no crushing of the soldered portion occurs, that is, a phenomenon quite different from the case of the molten solder is expected. In other words, it is expected that the probability of the occurrence of the short circuits between electrodes due to the outflow of Sn is low. Thus, the outflow of solder can be prevented even with an epoxy resin which is so designed that it becomes somewhat soft even when a filler is added. From the result of FIG. 13, in assuming that the complete melting of Sn occurs and that a modulus of elasticity of the resin in inverse proportion to the volume expansion ratio is allowed, the allowable modulus of elasticity of the resin becomes 500 MPa. Actually, the effect of the reaction of Cu particles can be expected, so that it is expected that no outflow occurs even with a resin having a high modulus of elasticity. In a case where the use of an epoxy resin is possible, the dividing of a substrate can be mechanically performed, and it becomes unnecessary to make cuts in the resin by means of a laser etc., so that the productivity and efficiency are also improved.

The above module mounting can also be applied to other ceramic substrates, organic metal-core substrates and built-up substrates. Furthermore, the chip element can be bonded both in a face-up manner and in a face-down manner. As regards the module, the invention can also be applied to surface-acoustic-wave (SAW) modules, power MOSIC modules, memory modules, multichip modules, and etc.

Embodiment 14

Figure 14:
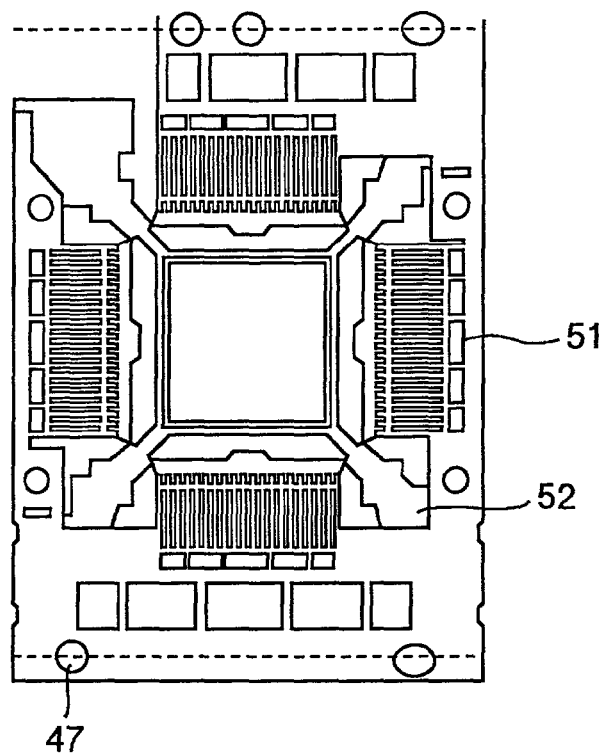
FIG. 14(a) to 14(c) are a plan view of a high-output resin package and a sectional view of the package.
Figure 14:
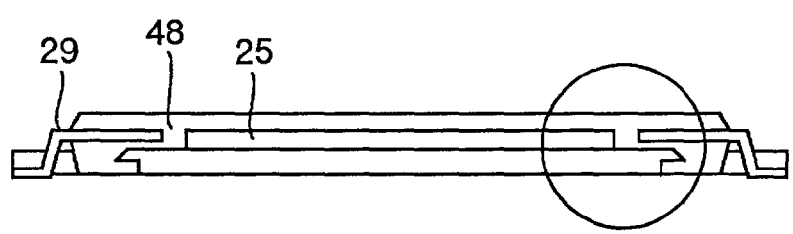
Figure 14:
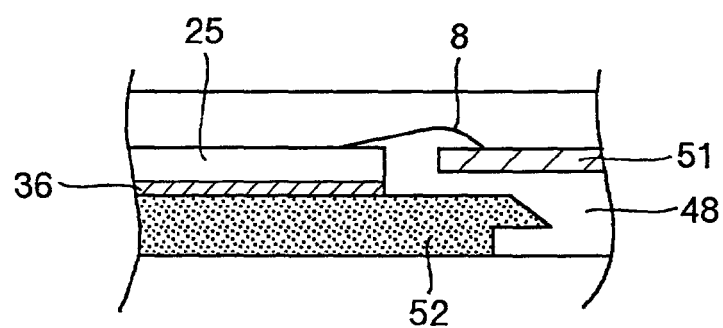

Next, there is described an example of application of the invention to the resin package of a high-output chip such as a motor-driver IC. FIG. 14(a) is a plan view of the high-output resin package in which a lead frame 51 and a thermal-diffusion plate 52 are bonded together and caulked. FIG. 14(b) is a sectional view of the package. FIG. 14(c) is a partially enlarged view of a circle portion in FIG. 14(b). In this example, a semiconductor chip 25 is bonded to a thermal-diffusion plate (heat sink) 52 by use of the solder paste relating to the invention. The lead 51 and the terminals of the semiconductor chip 25 are bonded together by wire bonding and are resin encapsulated. The lead is made of a Cu-base material.

Figure 15:
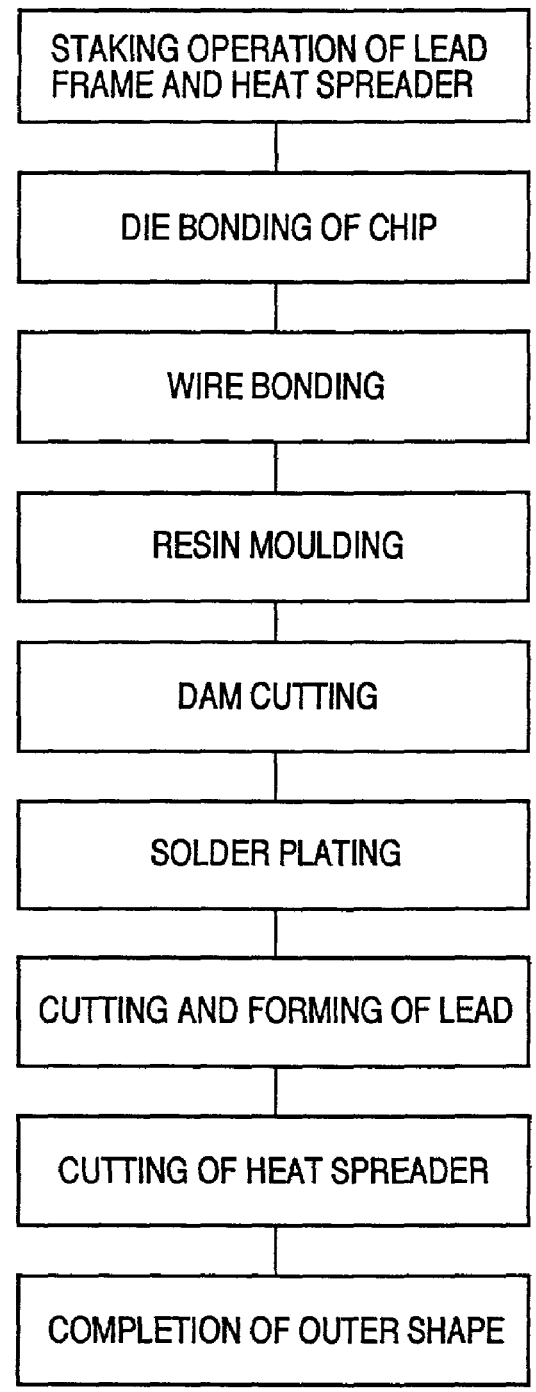
FIG. 15 is a flow chart of the process of a high-output resin package.

FIG. 15 is a flow chart of the steps of the high-output resin package. First, onto the lead frame 51 and the thermal-diffusion plate 52 both joined by caulking is die-bonded a semiconductor chip 25 by supplying a solder paste 3. The semiconductor chip 25 bonded by the die bonding is further wire bonded, as shown in the figure, by means of the lead 51, a gold wire 8 and etc. After that, the resin encapsulation is performed and the Sn-base solder plating is performed after the dam cutting. Then, lead-cutting and lead-forming are performed, the cutting of the thermal-diffusion plate being performed, whereby the package is completed. The back-side pads of the chip can be metallized by a material usually used, such as Cr—Ni—Au, Cr—Cu—Au and Ti—Pt—Au. Even in a case where the Au content is large, good results are obtained insofar as a Au-rich compound having a high Au—Sn melting point is formed. As regards the die bonding, it is performed by means of a resistance heating body with an initial pressure of 1 kgf, at 300° C. for 5 seconds after the supply of the solder by printing.

For a large chip, it is preferred that, in the case of an especially hard Zn—Al-base solder, high reliability be ensured by adding rubber and a low-expansion filler.

Embodiment 15

Figure 16:
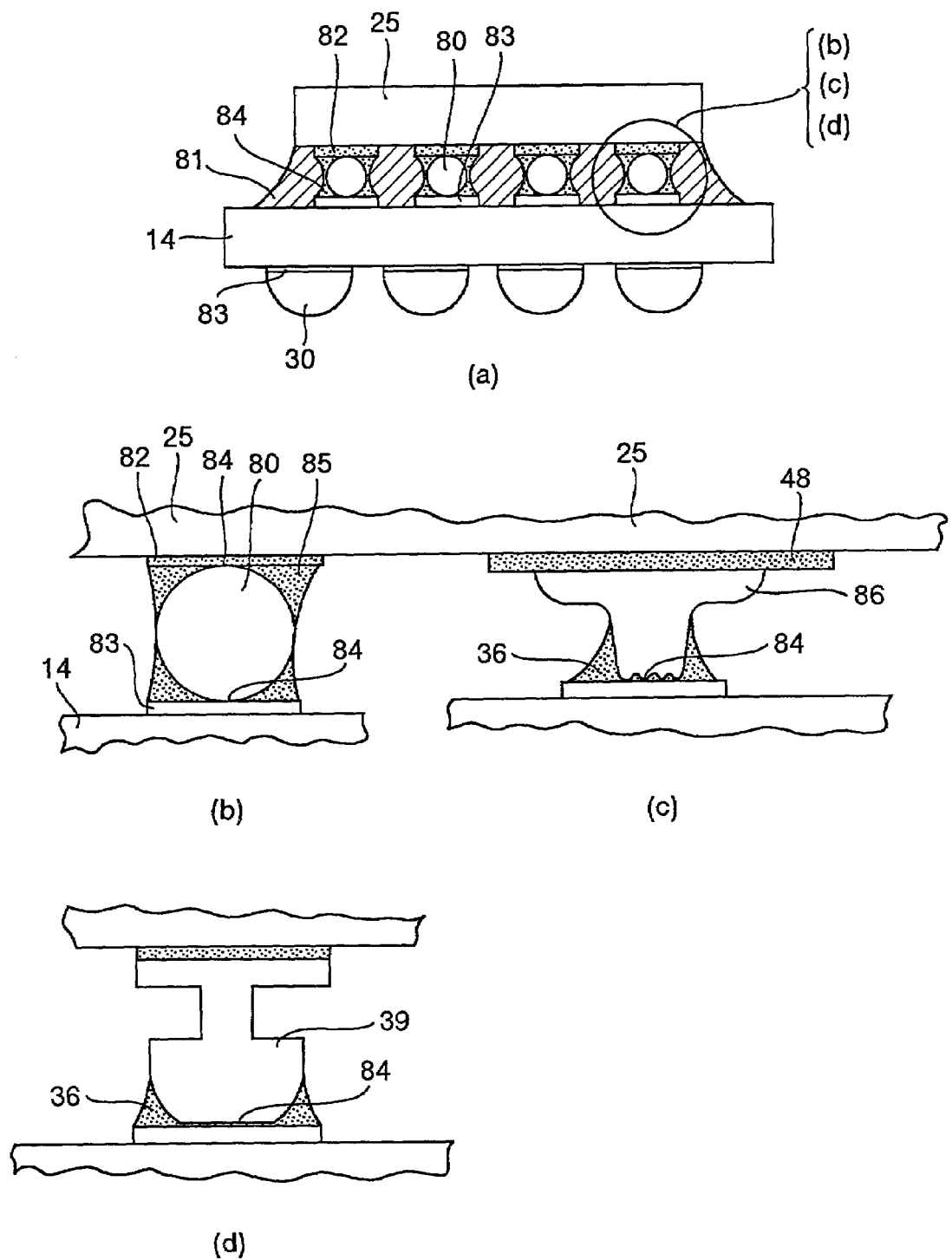
FIG. 16(a) to FIG. 16(d) are sectional views of a model of CSP junctions obtained by the bonding of composite balls.

FIG. 16(a) to FIG. 16(d) show, regarding examples of BGA and CSP, a package of a chip 25 and a junction substrate 14 which package is obtained by the temperature-hierarchical bonding of the Pb-free solder by use of Cu balls 80 capable of keeping a strength even at 270° C. Conventionally, the temperature-hierarchical bonding was performed by use of high melting Pb-(5–10)Sn solders for bonding a chip and a ceramic junction substrate together. However, when Pb-free solders are to be used, there is no means that replace the conventional one. Therefore, there is provided such a structure as, by use of a Sn base solder and a compound occurring thereby, a bonded portion is not melted at the time of the reflow to thereby maintain a bonding strength even when the portion of the solder is melted. FIG. 16(a) shows a sectional model of BGA/CSP, in which an organic substrate such as a built-up substrate was used as the junction substrate although a built-up substrate, metal-core substrate, ceramic substrate and etc., can be considered. As regards the shape of a bump, there are a ball bump (FIG. 16(b)), a wire bond bump (FIG. 16(c)) and a Cu-plated bump of a readily deformable structure (FIG. 16(d)). The external connection terminals are Cu pads or Sn—Ag—Cu-base solder portions 30 fed through balls or paste on Ni/Au-plating portions 83.

In the case shown in FIG. 16(a), it becomes possible to obtain bonding capable of withstanding the reflow by the steps of: feeding Sn onto a thin-film pads 82 on the side of the Si chip 25 by means of vapor deposition, plating, a paste, or the composite paste including metal balls and solder balls; thermally pressure-bonding thereto metal balls 80 such as balls of Cu, Ag, Au, etc. or Au-plated Al balls, or metallized organic resin balls to thereby form an intermetallic compound 84 with Sn at contact portions 84 in contact with the thin-film pad material (Cu, Ni, Ag, etc.) or in the vicinity of this contact portion. Next, the ball pads formed on the above chip is positioned on the pads of a junction substrate (an Al$_2$O$_3$, AlN, an organic, a built-up substrate or a metal-core substrate), to which pads a paste comprising metal balls, a solder (Sn, Sn—Ag, Sn—Ag—Cu, Sn—Cu, etc. or those containing at least one of In, Bi and Zn) and balls is supplied beforehand, and is thermally pressure-bonded, whereby similarly a compound 84 of the pads 83 of the junction-substrate and Sn is formed to thereby make it possible to provide a structure capable of withstanding 280° C. Even when the bump height varies, the variation is compensated for by the composite paste. Thus, it becomes possible to obtain BGA or CSP or high reliability in which stress burden to each of the solder bumps and to the Si chip pads is small with the result that the service life of the bumps is increased and in which, for the mechanical protection against the impact of fall and etc., the filling is formed with a solvent-free resin 81 superior in fluidity having Young's modulus in the range of 50 to 15000 Mpa and a coefficient of thermal expansion of 10 to 60×10$^{-6}$/° C.

The processes of FIG. 16(b) to FIG. 16(d) are described below.

Figure 17:
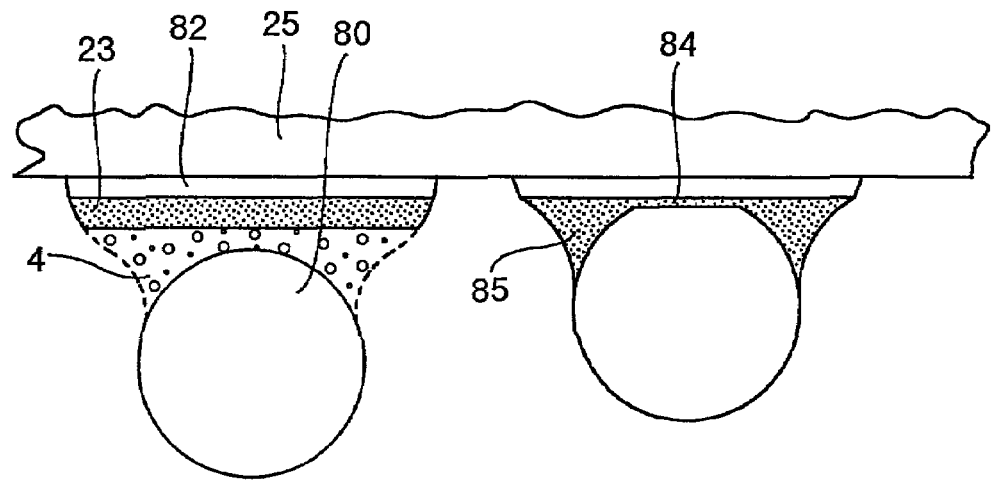
FIG. 17(a) to FIG. 17(c) are sectional views of a model of BGA/CSP in which Cu ball bumps are used.
Figure 17:
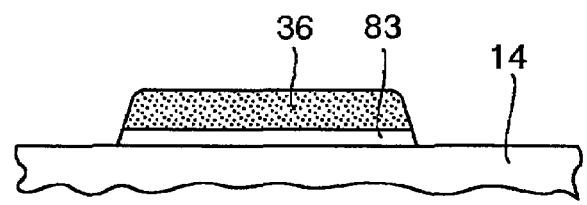
Figure 17:
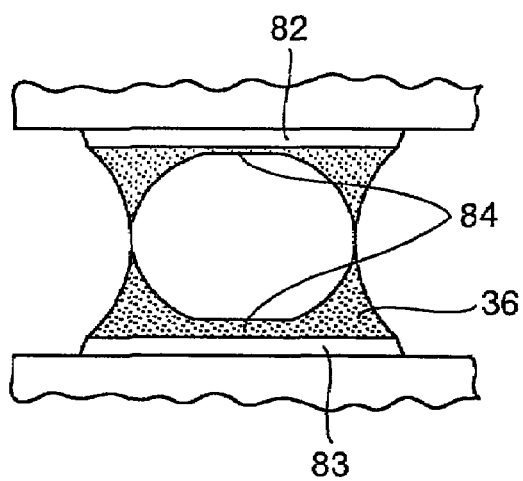

FIG. 17(a) to FIG. 17(c) show a bonding process for bonding the Si chip 25 and the junction substrate 14 together, by the system of the Cu ball 80 shown in FIG. 16(b). Although the electrode terminals 82 on the chip 20 are made of Ti/Pt/Au in this case, the material is not limited to the Ti/Pt/Au. In the stage of wafer process, an Sn plating, an Sn—Ag—Cu-base solder or a composite paste 85 containing metal balls and solder balls is fed to the thin-film pads 82 formed on each chip. Au is provided mainly for the prevention of surface oxidation and is as thin as not more than 0.1 μm. Therefore, Au dissolves in the solder in a solid solution state after melting. As regards the Pt—Sn compound layers, there are present various compounds such as $Pt_3Sn$ and $PtSn_2$. When the diameter of the ball 80 is large, it is desirable to adopt a printing method capable of supplying a thick solder 85 for fixing the balls. Alternatively, balls which are solder plated beforehand may be used.

FIG. 17(a) shows a state in which a 150-μm metal ball (Cu ball) 80 is positioned and fixed by a metal-mask guide after the application of a flux 4 onto the terminal plated with Sn 23. To ensure that all balls on the wafer or chip come into positive contact with the central part of the thin-film pads 82, melting under pressure is performed at 290° C. for 5 seconds by means of a flat pulse-current resistance heating body, etc. Due to size variations of Cu balls in the chip, some balls do not come into contact with the pad portions, however, in a case where these balls are close to the pad portions, the possibility of the forming of an alloy layer becomes high, although this depends on the plastic deformation of Cu at high temperatures. Even if there are a few bumps which are in contact with the pad portions via an Sn layer without the forming of the alloy layer, there is no problem insofar as the majority of the bumps form the alloy layer. In the case of the composite paste 34, even when the Cu ball 80 does not come into contact with the pad portion, the pad portions are connected to the Cu ball by the alloy layer formed after the bonding and the strength is ensured even at high temperatures.

The section of the electrode portion after melting is shown in FIG. 17(b). The Cu ball comes into contact with the terminal, and a contact portion 84 is bonded by compounds of Pt—Sn and Cu—Sn. Even in a case where the contact portions are not bonded completely by the compounds, there is such a case as the alloy layer grow because of heating, pressurization, etc. in succeeding steps with the resut that the joining thereof is achieved. Although Sn fillets are formed in the surrounding area, Sn often does not always wet to spread on the whole Cu. After the bonding of the ball, cleaning is performed for each wafer or chip (in the case of a wafer, the wafer is cut for each chip), the back side of the chip being then attracted by means of the pulse-current resistance heating body, the ball terminal being positioned and fixed to a composite past 36 formed on the electrode terminal 83 of a built-up junction substrate 14, and melting under pressure is performed at 290° C. for 5 seconds while spraying a nitrogen gas. A flux may be used when no resin-filling is performed in the succeeding step.

FIG. 17(c) shows a section after the melting under pressure. From the electrode terminal 82 on the chip side to the electrode terminal 83 on the junction substrate side, all of the high-melting metals and the intermetallic compounds etc. 41 are connected to each other in succession, so that no exfoliation occurs even in the succeeding reflow step. Due to height variations of the ball bumps, some bumps do not come into contact with the pads on the junction substrate. However, because these ball bumps are connected by the intermetallic compounds 84, there occurs no problem even during the reflow.

FIG. 16(c) shows an example in which a wire bonding terminal (Cr/Ni/Au, etc.) 48 on the Si chip side and a wire bumping terminal 86, etc. of Cu, Ag or Au etc. are bonded together by thermal pressure bonding (in some cases, an ultrasonic wave may be applied thereto). The feature of the wire bumping terminal are its shape deformed by capillaries and its torn neck portion. Although height variations in the torn neck portion are large, in some of them the irregular heights are made to be flat during the 1pressurization and, since it is bonded by the mixture paste, there occurs no problem. As the material for the wire bumping terminal, there are materials of Au, Ag, Cu and Al which wet well with Sn and are soft. In the case of Al, the use is limited to solders which wet with Sn and the range of the selection is narrow, however, it is possible to use Al. Similarly to the case shown in FIG. 16(b), since the cleaning of a narrow gap causes difficulties in operation, it is made to be a premise that a non-cleaning process is used. After the positioning, it becomes possible to similarly form the intermetallic compound 84 of both of Sn and the pad of the junction substrate by performing thermal pressure bonding while spraying a nitrogen gas, an intermetallic compound 41 of the junction substrate electrode with Sn can be formed similarly, so that a bonding structure capable of withstanding 280° C. can be obtained similar to the case of FIG. 16(b).

Figure 18:
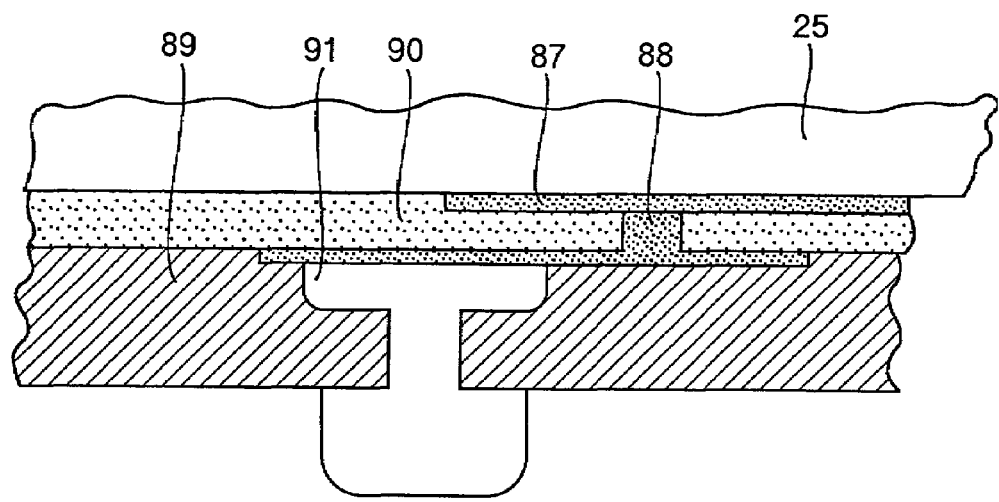
FIG. 18(a) to FIG. 18(c) are sectional views of a model of BGA/CSP in which Cu-coated bumps of deformed structure are used.
Figure 18:
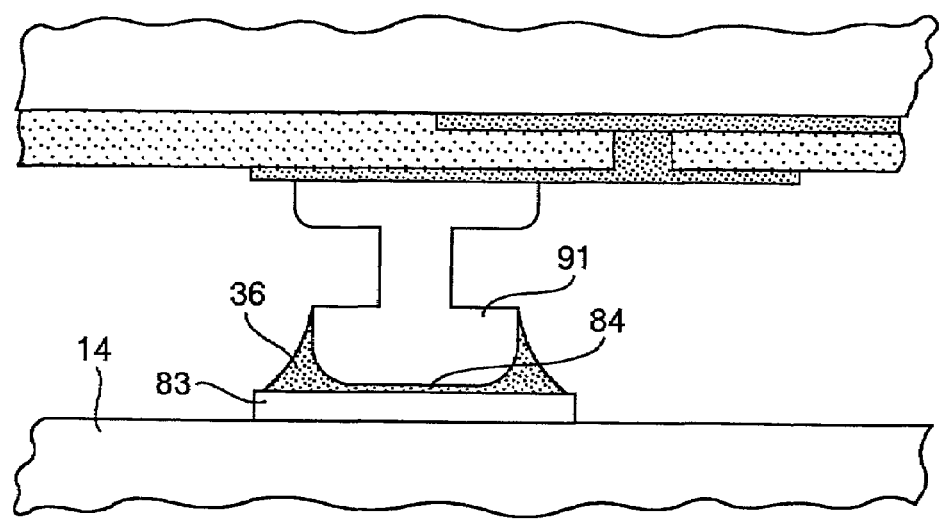

The process for producing the structure of FIG. 16(d) is shown in FIGS. 18(a) and 18(b). The process is a system in which, in the wafer process, the relocation is performed by a Cu terminal 87 and a polyimide insulating film 90 etc. on a semiconductor device of Si chip 25 and in which bumps are then formed by Cu plating 88. By use of a photoresist 89 and Cu-plating technology there is provided a Cu-plated bump structure 91 which is not a simple bump but has a thin neck portion readily deformable under stresses in a plane direction. FIG. 18(a) is a sectional drawing of a model formed in the wafer process, in which, in order to ensure that no stress concentration occurs on the relocated terminal, a readily deformable structure is formed by use of the photoresist 89 and plating and thereafter the photoresist is removed so that a Cu bump may be formed. FIG. 18(b) shows the section of a bonding portion formed between the Cu bump 91 and the Cu terminal through the intermetallic compound 84 of $Cu_6Sn_5$ by the steps of coating the junction substrate 14 with a composite paste of Cu and Sn, positioning the Cu bump 91 of the chip, and pressurizing and heating it (at 290° C. for 5 seconds) in a nitrogen atmosphere without using a flux.

Embodiment 16

Next, to examine an appropriate range of the ratio of the metal balls included in the solder paste (Cu was selected as a representative component) to solder balls (Sn was selected as a representative component), the weight ratio of Sn to Cu (Sn/Cu) was varied. The result of the examination is shown in FIG. 19. As regards a method of evaluation, the section of a bonding portion after the reflow was observed and appropriate amounts of the mixed components were examined from the states of the contact and/or the approaching of Cu particles, etc. The flux used here was a usual non-cleaning type. As regrads the particle sizes of Cu and Sn, relatively large particles of 20 to 40 μm were used. As the result, it is found that the Sn/Cu ratio range is preferably in the range of 0.6 to 1.4 and more preferably 0.8 to 1.0. Unless the particle size is 50 μm or less at most, it is impossible to adapt to the fine design (regarding the pitch, the diameter of each of the teminals, and the space therebetween), and the level of 20 to 30 μm is readily used. The fine particles of 5 to 10 μm is also used as particle size that provide a margin with respect to the above fine design. However, in the case of an excessively fine size, since the surface area increases and since the reducing capability of the flux is limited, there occur such problems as the solder balls remain and as the characteristic of the softness of Sn is lost due to the acceleration of the Cu—Sn alloying. The solder (Sn) does not relate to particle size because it eventually melts, however, it is necessary that in a paste state, Cu and Sn be uniformly dispersed, so that it is basic to make the particle size of the two be in the same level. Further, it is necessary to plate the surfaces of the Cu particles with Sn to a coating thickness of about 1 μm so that the solder becomes wettable. This enables the burden on a flux to be reduced.

In order to reduce the rigidity of the composite solder, it is effective to disperse among the metal and solder balls the soft, metallized plastic balls. In particular, in the case of a hard metal, this is effective in improving the reliability because the soft plastic balls act to reduce the deformation and thermal impact. Similarly, by dispersing substances of low thermal expansion, such as invar, silica, AlN and SIC, which are metallized in the composite solder, stresses in the joint can be reduced, so that the high reliability can be expected. Incidentally, the alloy is noted as a new material that lowers the melting points, not for reasons of the mechanical properties, however, because the alloy is in general a hard material, it can be improved by dispersing the soft metal balls such as metallized Al, the plastic balls, and etc.

The effects obtained by the representative essential features of the invention are briefly described below.

According to the invention, it is possible to provide the solder capable of maintaining strength at high temperatures in the temperature-hierarchical bonding.

Further, according to the invention, it is possible to provide a method of temperature-hierarchical bonding in which the solder capable of maintaining strength at high temperatures is used.

Moreover, according to the invention, it is possible to provide the electronic device which is bonded by use of the solder capable of maintaining strength at high temperatures.

What is claimed is:

1. An electronic device comprising a semiconductor device provided with pads and a substrate provided with pads on which said semiconductor device is mounted, said pads of said semiconductor device being bonded to said pads of said substrate through junctions comprising CuSn compounds and Cu balls, said CuSn compounds resulting from a mixture of said Cu balls and an Sn-based solder subjected to a bonding operation at a temperature above the melting point temperature of said Sn-based solder but less than the melting point temperature of said Cu balls, wherein said Cu—Sn compound includes $Cu_6Sn_5$ and $Cu_3Sn$ and said $Cu_3Sn$ is disposed in a region between said Cu-balls and said $Cu_6Sn_5$.

2. An electronic device according to claim 1, wherein said $Cu_6Sn_5$ has a thickness of about a few micrometers.

3. An electronic device according to claim 1, wherein said $Cu_6Sn_5$ is formed by reflowing said Cu-balls and Sn-base solder at a temperature higher than a melting point of said Sn-base solder and lower than a melting point of said Cu-balls.

4. An electronic device according to claim 3, wherein said Sn-base solder comprises eutectic Sn—Cu solder, eutectic Sn—Cu solder to which at least one of In, Zn and Bi is added, eutectic Sn—Ag solder, eutectic Sn—Ag solder to which at least one of In, Zn and Bi is added, eutectic Sn—Ag—Cu solder, or eutectic Sn—Ag—Cu solder to which at least one of In, Zn and Bi is added.

5. An electronic device according to claim 3, wherein said Cu-balls have a diameter greater than 5 micrometers.

6. An electronic device comprising a semiconductor device provided with pads and a substrate provided with pads on which said semiconductor device is mounted, said pads of said semiconductor device being bonded to said pads of said substrate by way of junctions, each junction including a Cu—Sn compound containing $Cu_6Sn_5$ and $Cu_3Sn$ and Cu balls resulting from a mixture of said Cu balls and an Sn-based solder subjected to a bonding operation at a temperature above the melting point temperature of said Sn-based solder but less than the melting point temperature of said Cu balls, said $Cu_3Sn$ being formed at peripheries of said Cu balls.

7. An electronic device according to claim 6, wherein said Cu—Sn compound is formed by reflowing said Cu-balls and Sn-base solder at a temperature higher than a melting point of said Sn-base solder and lower than a melting point of said Cu-balls.

8. An electronic device according to claim 7, wherein said Sn-base solder comprises eutectic Sn—Cu solder, eutectic Sn—Cu solder to which In, Zn or Bi is added, eutectic Sn—Ag solder, eutectic Sn—Ag solder to which In, Zn or Bi is added, eutectic Sn—Ag—Cu solder or eutectic Sn—Ag—Cu solder to which In, Zn or Bi is added.

9. An electronic device according to claim 7, wherein said Cu-balls have a diameter greater than 5 micrometers.

* * * * *